United States Patent
Sugano et al.

(10) Patent No.: US 6,693,258 B2
(45) Date of Patent: Feb. 17, 2004

(54) PROCESS FOR PRODUCING THIN FILM SEMICONDUCTOR DEVICE AND LASER IRRADIATION APPARATUS

(75) Inventors: Yukiyasu Sugano, Kanagawa (JP); Masahiro Fujino, Kanagawa (JP); Michio Mano, Kanagawa (JP); Akihiko Asano, Kanagawa (JP); Masumitsu Ino, Kanagawa (JP); Takenobu Urazono, Kanagawa (JP); Makoto Takatoku, Kanagawa (JP)

(73) Assignee: Sony Corporation (JP)

( * ) Notice: Subject to any disclaimer, the term of this patent is extended or adjusted under 35 U.S.C. 154(b) by 181 days.

(21) Appl. No.: 10/061,392

(22) Filed: Feb. 4, 2002

(65) Prior Publication Data

US 2002/0096680 A1 Jul. 25, 2002

Related U.S. Application Data

(62) Division of application No. 09/478,812, filed on Jan. 7, 2000.

(30) Foreign Application Priority Data

Jan. 8, 1999 (JP) .......................................... P11-002384
Jan. 8, 1999 (JP) .......................................... P11-002385
Jan. 20, 1999 (JP) .......................................... P11-012498

(51) Int. Cl.[7] .............................................. H01L 29/76
(52) U.S. Cl. .................................................. 219/121.8
(58) Field of Search ........................ 219/121.8, 121.61, 219/121.78, 121.79, 121.81, 121.83, 121.67, 121.68, 121.69, 121.7, 121.71, 121.72

(56) References Cited

U.S. PATENT DOCUMENTS

| | | | |
|---|---|---|---|
| 4,609,407 A | * | 9/1986 | Masao et al. ............... 438/155 |
| 4,693,759 A | | 9/1987 | Noguchi et al. .............. 437/24 |
| 4,719,123 A | * | 1/1988 | Haku et al. .................. 438/482 |
| 5,352,291 A | | 10/1994 | Zhang et al. ................... 117/8 |
| 5,365,875 A | | 11/1994 | Asai et al. ...................... 117/7 |
| 5,424,244 A | | 6/1995 | Zhang et al. ................. 437/173 |
| 5,529,951 A | | 6/1996 | Noguchi et al. ............. 437/174 |
| 5,612,251 A | | 3/1997 | Lee ............................. 437/173 |
| 5,798,744 A | | 8/1998 | Tanaka et al. ................. 345/92 |
| 5,856,858 A | | 1/1999 | Carey et al. ................. 349/158 |
| 5,894,151 A | | 4/1999 | Yamazaki et al. ........... 257/347 |
| 6,025,217 A | | 2/2000 | Kanaya et al. .............. 438/166 |

FOREIGN PATENT DOCUMENTS

JP          A-7-235490          9/1995

* cited by examiner

*Primary Examiner*—Tom Dunn
*Assistant Examiner*—Jonathan Johnson
(74) *Attorney, Agent, or Firm*—Rader, Fishman & Grauer PLLC; Ronald P. Kananen

(57) ABSTRACT

A polycrystalline thin film of good quality is obtained by improving a crystallization process of a semiconductor thin film using laser light. After conducting a film forming step of forming a non-single crystal semiconductor thin film on a surface of a substrate, an annealing step is conducted by irradiating with laser light to convert the non-single crystal semiconductor thin film to a polycrystalline material. The annealing step is conducted by changing and adjusting the cross sectional shape of the laser light to a prescribed region. The semiconductor thin film is irradiated once or more with a pulse of laser light having an emission time width from upstand to downfall of 50 ns or more and having a constant cross sectional area, so as to convert the semiconductor thin film contained in an irradiated region corresponding to the cross sectional area to a polycrystalline material at a time. At this time, the energy intensity of laser light from upstand to downfall is controlled to apply a desired change. According to the procedures, a polycrystalline material having a large particle diameter or a uniform particle diameter can be obtained. In some cases, upon irradiation with laser light, the substrate may be maintained in a non-oxidative atmosphere, or may be heated or cooled.

30 Claims, 31 Drawing Sheets

PROCESS FOR PRODUCING THIN FILM SEMICONDUCTOR DEVICE AND LASER IRRADIATION APPARATUS

This application is a divisional of Ser. No. 09/478,812 filed Jan. 7, 2000, now pending.

BACKGROUND OF THE INVENTION

1. Field of the Invention

The present invention relates to a process for producing a thin film semiconductor device and a laser irradiation apparatus. The laser irradiation apparatus is used for crystallizing a semiconductor thin film by using excimer laser light in the process for producing a thin film semiconductor device.

2. Description of the Related Art

A thin film transistor used for switching pixels of an active matrix type liquid crystal display device, a thin film transistor formed in a peripheral circuit driving a switching transistor, and a thin film transistor used in a load device type static RAM employ an active layer comprising amorphous silicon or polycrystalline silicon. Since polycrystalline silicon has higher mobility than amorphous silicon, a thin film transistor of high performance can be obtained. However, because polycrystalline silicon contains non-bonding pairs of silicon atoms in a high density in comparison to single crystal silicon, the non-bonding pairs cause a leakage electric current on channel off. As a result, it becomes a cause of lowering the operation speed on switch on. Therefore, in order to improve the characteristics of the thin film transistor, it is demanded to form a semiconductor thin film of polycrystalline silicon having less crystal defects and excellent uniformity. As a process for forming such polycrystalline silicon thin film, a chemical gas phase growing method and a solid phase growing method are proposed. As means for decreasing the non-bonding pairs, which causes the leakage electric current, a hydrogenation technique is employed, in which the non-bonding pairs are terminated by doping hydrogen in the polycrystalline silicon thin film. However, when crystals having a large particle size are grown by the chemical gas phase growing method to form a polycrystalline silicon thin film, the film thickness thereof becomes uneven. Accordingly, it is difficult to form a transistor having uniform device characteristics by using the polycrystalline silicon thin film.

As a process for forming a polycrystalline semiconductor thin film considering the problems described above, an annealing treatment using excimer laser light is proposed. In this process, a non-single crystal semiconductor thin film, such as amorphous silicon and polycrystalline silicon having a relatively small particle diameter, formed on an insulating substrate is irradiated with laser light to locally heated, and the semiconductor thin film is converted into polycrystals having a relatively large particle diameter (crystallization) during the cooling process. A thin film transistor is formed by integrating using the semiconductor thin film thus crystallized as an active layer (channel region). By using the laser annealing, a thin film semiconductor device can be produced by a low temperature process, and an inexpensive glass substrate can be used instead of an expensive quartz substrate excellent in heat resistance. Furthermore, because the excimer laser light is in the ultraviolet region, which results in large absorption coefficient for silicon, it has an advantage in that only the surface of the silicon can be locally heated but the insulating substrate is not thermally damaged. A method of the laser annealing includes a first method, in which an amorphous silicon thin film is directly irradiated with excimer laser light to convert into polycrystals, and a second method, in which a polycrystalline silicon thin film formed by solid phase growth is irradiated with excimer laser light at such an energy level that the whole film is not melted to conduct annealing.

The first method, the direct annealing of the amorphous silicon thin film, is advantageous for mass production of an LSI in future since it is simple in process in comparison to the second method. Furthermore, when a large area can be subjected to the bulk annealing treatment by irradiation of excimer laser light at a time, it is further advantageous for mass production. However, in the case where a conventional laser irradiation apparatus is used for the direct annealing of an amorphous silicon thin film, it has been difficult to obtain excimer laser light that has a large area with uniform cross sectional distribution of energy at a single shot sufficient to obtain a polycrystalline silicon thin film excellent in crystallinity and having small density of grain boundary trap. In order to solve the problem, an excimer laser irradiation apparatus is being developed that has such high output energy that a large area can be subjected to the bulk annealing treatment with a single shot at a time. Furthermore, in order to improve the effect of annealing using excimer laser light, a method is proposed, in which a substrate is previously heated to several hundreds degrees centigrade, and then the direct annealing of the amorphous silicon is conducted. However, even by using the excimer laser irradiation apparatus of high output energy, process conditions for obtaining a polycrystalline silicon thin film excellent in crystallinity and having small density of grain boundary trap have not yet been established. Furthermore, in the conventional direct annealing method of amorphous silicon, the crystalline particle diameter of polycrystalline silicon obtained is 50 nm or less in average, and thus further increase in crystalline particles size is demanded. In the laser annealing process using such a laser irradiation apparatus of high output of an emission duration of 50 ns or more, the crystallization process is conventionally conducted in the air. In this case, however, crystal defects are formed by combining oxygen in the air and silicon, and therefore there is a problem in that the mobility of the thin film transistor is not so improved that expected from the particle diameter (grain size) of the polycrystalline silicon.

As for the laser irradiation apparatus emitting excimer laser light, because output energy of laser light of the conventional apparatus is small (about 0.5 J), a method has been generally employed in that a linear beam having an irradiation area of 200 mm×0.6 to 0.7 mm is irradiated with an overlap of about from 90 to 95%. In this method, however, the output stability of laser is poor (about ±10% in the current situation), and non-uniformity of crystals is caused at a part where the output energy becomes unexpectedly large or small. When a circuit is integrated and formed on such a part, it becomes a cause of operation failure. It is also considered to employ an overlap of the laser beam of about 99% to disperse the dispersion of output as possible. However, such a method involves a problem in that the throughput becomes extremely poor to bring about increase in production cost. When the crystallization is conducted by using the conventional linear laser beam with an overlap, for example, of 95%, it requires about 6 minutes for treating a substrate of 400 mm×500 mm. When the same substrate is treated with an overlap of the linear laser beam of 99%, it requires 30 minutes. Furthermore, since the laser annealing is generally conducted in vacuum, it requires about 5 minutes for loading and unloading of the substrate.

In recent years, an excimer laser irradiation apparatus having high output energy that can conduct the annealing treatment of a large area with a single shot at a time has been developed as described in the foregoing. For example, an area of about 27 mm×67 mm can be irradiated at a time by using, for example, an excimer laser light source having output of 10 J. However, in order to produce a large area LCD panel having a dimension across corners of about 20 inches (about 120 mm×160 mm) required for a large display, a "boundary part" of laser irradiation is necessarily formed in either method. There is a problem in that when the other part than the "boundary part" is irradiated at optimum energy, the "boundary part" is over-irradiated, in which the semiconductor thin film is microcrystallized to deteriorate the performance of the thin film transistor.

FIGS. 1A to 1C are diagrams schematically showing the conventional laser irradiation treatment for converting amorphous silicon formed on a glass substrate to polycrystalline silicon. In the case where a semiconductor thin film formed on an insulating substrate 0 having a larger area than the cross sectional area of the laser light is irradiated, scanning of the laser light must be conducted relatively with respect to the insulating substrate 0. In this case, the once irradiated region (FIG. 1A), the twice irradiated region (FIG. 1B), and the four times irradiated region (FIG. 1C) are formed in the surface of the glass substrate, to cause unevenness in particle diameter of polycrystalline silicon. As shown in FIG. 1C, the twice irradiation region and the four times irradiated region are the so-called "boundary part", in which the diameter of the individual crystal particles is different from the crystal particle diameter in the once irradiated region.

The method where a relatively large area (for example, about 2.7 cm×6.7 cm) is crystallized at a time by using a laser irradiation apparatus of high output as described in the foregoing is described, for example, in JP-A-7-235490. When a laser irradiation apparatus having extremely high output can be used, the semiconductor thin film formed on the whole surface of the substrate can be crystallized at a time. By using such a method, the throughput of the laser annealing becomes a little more than 1 minute, and thus the productivity is improved by about 5 times in comparison to the method where scanning with a linear laser beam is conducted. Furthermore, it is known that because a relatively large area is crystallized at a time, good uniformity can be obtained, and the surface homology after crystallization is improved. In a practical process, however, because the substrate is exposed to the air after forming the semiconductor thin film until the laser annealing, contamination substances and dusts from the air are attached to the surface thereof, and a removal step of them is necessary. Thus, a problem arises in that the advantage of increasing the throughput by conducting the bulk annealing is spoiled. In addition, there is a problem in that there is a limit to improving the quality of the semiconductor thin film by employing the conventional simple method, in which the semiconductor thin film is formed, and then crystallization is conducted by irradiating with laser light. Furthermore, it is practically difficult to develop a laser irradiation apparatus having total output energy exceeding 10 J. Therefore, it is impossible to crystallize a semiconductor thin film formed on a large scale substrate (for example, 30 cm×30 cm or larger) at a time. For this reason, the crystallization is conducted by separating certain regions (about 2.7 cm×6.7 cm) as shown in FIGS. 1A to 1C, and therefore there is a problem in that non-uniformity tends to occur at the boundary part between the laser irradiated parts. Furthermore, non-uniformity in transistor characteristics occurs due to the dispersion in energy among the shots of laser irradiation. As a result, in the case where an active matrix display device is formed by integrating and forming thin film transistors, non-uniform display occurs in the pixel array part, and decrease in operation margin occurs in the peripheral driving circuit part. Because oscillation frequency of the laser irradiation apparatus of high output used for crystallization by bulk irradiation is 1 Hz or lower, there is a tendency that the productivity thereof is not good in comparison to a laser annealing irradiation apparatus of low output having an oscillation frequency reaching several hundreds Hz. Furthermore, while a semiconductor thin film is converted from amorphous to polycrystalline by irradiation with laser light to obtain a polycrystalline semiconductor thin film, such as polycrystalline silicon as described in the foregoing, the substrate carrying the semiconductor thin film is maintained at room temperature or is heated on conducting irradiation with laser light. However, the size of crystalline particles is increased by this method, but there is a problem in that characteristics, such as a threshold voltage and an on electric current, of a TFT using a polycrystalline semiconductor thin film as an active layer tend to exhibit large dispersion.

SUMMARY OF THE INVENTION

An object of the invention to solve the problems associated with the conventional techniques described above to form a semiconductor thin film comprising polycrystalline silicon excellent in crystallinity on an insulating substrate, and additionally to provide a laser irradiation apparatus realizing the same. The invention comprising the following means to achieve the objects includes a first aspect and a second aspect. The first aspect relates to a process for producing a thin film semiconductor device comprising a film forming step of forming a semiconductor thin film comprising an amorphous material or a polycrystalline material having a relatively small particle diameter on a substrate; an irradiation step of irradiating the semiconductor thin film with an energy beam to convert the amorphous material or the polycrystalline material having a relatively small particle diameter to a polycrystalline material having a relatively large particle diameter; and a forming step of integrating and forming a thin film transistor in a prescribed region by using the semiconductor thin film thus converted to the polycrystalline material as an active layer, wherein the irradiation step is bulk irradiation conducted in such a manner that a cross sectional shape of the energy beam is adjusted with respect to the region to crystallize the region at a time by a single shot irradiation, so that characteristics of the thin film transistor are made uniform. For example, the forming step may comprise integrating the thin film transistors to form a thin film semiconductor device for a display panel equipped with a pixel array and a scanner circuit, and the irradiation step may comprise irradiating a region, on which the scanner circuit is integrated and formed, at a time. The irradiation step may comprise making uniform threshold value characteristics of the thin film transistor contained in the region by the bulk irradiation. In this case, the forming step may comprise forming, in the region, at least one circuit selected from an operational amplifier circuit, an analog-digital conversion circuit, a digital-analog conversion circuit, a level shifter circuit, a memory circuit, and a microprocessor circuit. The first aspect of the invention further includes a laser irradiation apparatus, by which a semiconductor thin film comprising an amorphous material or a polycrystalline material having a relatively small particle diameter formed on a substrate is irradiated with laser light to convert into a polycrystalline material having a relatively large particle diameter. The laser irradiation apparatus comprises a laser light source emitting laser light having a prescribed cross sectional shape; shaping means of shaping the cross sectional shape of the laser light to adjust to a prescribed region; and irradiating means of irradiating a semiconductor thin film with the shaped laser light to uniformly crystallize in the region. A laser irradiation apparatus for irradiating a semiconductor thin film comprising an amorphous material or a polycrystalline material having a relatively small particle diameter formed on a substrate capable of carrying information for processing with laser light to convert into a polycrystalline material having a relatively large particle diameter is also included, wherein at least one condition selected from a cross sectional shape, an irradiating position, an energy amount, an energy distribution and a moving direction of the laser light is capable of being adjusted by reading the information. For example, the information is read by recognizing a pattern formed on a surface of the substrate. Alternatively, the information is read by detecting a code written in the substrate.

The second aspect of the invention relates to a process for producing a thin film semiconductor device comprising a film forming step of forming a semiconductor thin film comprising an amorphous material or a polycrystalline material having a relatively small particle diameter on a substrate, on which plural units are formed; an irradiation step of intermittently irradiating the semiconductor thin film with an energy beam moving with respect to the substrate, to convert the amorphous material or the polycrystalline material having a relatively small particle diameter to a polycrystalline material having a relatively large particle diameter; and a forming step of integrating and forming a thin film transistor by using the semiconductor thin film thus converted to the polycrystalline material as an active layer, to form thin film semiconductor devices in the respective units, wherein the irradiation step is bulk irradiation conducted in such a manner that a cross sectional shape of the energy beam is adjusted with respect to the unit to irradiate one or two or more units at a time by a single shot irradiation. It also relates to a laser irradiation apparatus, by which a semiconductor thin film comprising an amorphous material or a polycrystalline material having a relatively small particle diameter formed on a substrate, on which prescribed units are formed, is intermittently irradiated with laser light moving with respect the semiconductor thin film to convert into a polycrystalline material having a relatively large particle diameter, comprising a laser light source intermittently emitting laser light; an optical system for enlarging or reducing a cross sectional shape of the laser light to adjust to a unit; and shielding means for shielding a part other than the units from the laser light, wherein irradiation conducted by bulk irradiation of one or two or more units at a time by a single shot irradiation. Preferably, it comprises moving means for moving the substrate with respect to the laser light to make possible to irradiate all of the units with the laser light. Furthermore, it may comprise detecting means for optically reading a positioning mark provided on the substrate, and controlling means for controlling the moving means corresponding the mark thus read.

According to the first aspect of the invention, by using a laser irradiation apparatus having output that is capable of crystallizing a region having a prescribed area or more at a time, the cross sectional shape of the laser light can be changed and adjusted to the region, in which uniformity in device characteristics is required (such as a circuit region). The cross sectional shape of the laser light can be changed to set at the optimum shape for the respective products of various thin film semiconductor devices. By conducting the crystallization of a semiconductor thin film using such a laser irradiation apparatus, uniform polycrystalline can be formed on a prescribed region. By forming thin film transistors are integrated and formed thereon, uniform device characteristics can be realized, and a high performance circuit can be stably produced in the prescribed region. According to the second aspect of the invention, because the crystallization is conducted by irradiating each the respective units, on which the thin film semiconductor devices are formed, with laser light at a time by a single shot irradiation, the "boundary part" of laser light is substantially not present in the units, and uniformity can be realized. According to the manners, a uniform polycrystalline semiconductor thin film having a crystalline particle diameter reaching 1,500 nm (with a dispersion of about ±100 nm) having a small electron trap density in the particle boundary and inside the particles can be formed even in an active matrix type display device of a 20-inch class.

Another object of the invention is to increase productivity of laser annealing and to improve quality of a crystallized semiconductor thin film. In order to attain the objects, the following means as a third aspect have been conducted. That is, the invention relates to a process for producing a semiconductor thin film comprising a film forming step of forming a semiconductor thin film comprising an amorphous material or a polycrystalline material having a relatively small particle diameter on a substrate; and a laser annealing step of irradiating a prescribed region of the semiconductor thin film at a time with laser light having a prescribed cross sectional area to convert the amorphous material or the polycrystalline material having a relatively small particle diameter to a polycrystalline material having a relatively large particle diameter, wherein the film forming step and the laser annealing step are alternately repeated without exposing the substrate to the air, so as to accumulate the semiconductor thin films. It is preferred that the laser annealing step comprises irradiating with laser light at a condition in that $TE/(d \cdot S)$ is from 0.01 to 1, wherein d (nm) represents a thickness of the semiconductor thin film having been formed, TE (J) represents total energy of the laser light, and S ($cm^2$) represents an area of a region irradiated with the laser light at a time. It is also preferred that the laser annealing step is repeated with the laser light having such energy that is being increased along with the lapse of the steps. Alternatively, the film forming step is repeated to form a semiconductor thin film having such a thickness that is being decreased along with the lapse of the steps. The invention also relates to an apparatus for producing a semiconductor thin film comprising a film formation chamber where a semiconductor thin film comprising an amorphous material or a polycrystalline material having a relatively small particle diameter is formed on a substrate; and a laser annealing chamber where a prescribed region of the semiconductor thin film is irradiated at a time with laser light having a prescribed cross sectional area to convert the amorphous material or the polycrystalline material having a relatively small particle diameter to a polycrystalline material having a relatively large particle diameter, wherein the apparatus further comprises means for transporting the substrate back and forth between the film forming chamber and the laser annealing chamber without exposing the substrate to the air, so as to accumulate the semiconductor thin films by alternately repeating the film forming step and the laser annealing step. It is preferred that irradiation of laser light is conducted, in the laser annealing chamber, at a condition in that TE/(d·S) is from 0.01 to 1, wherein d (nm) represents a thickness of the semiconductor thin film having been formed, TE (J) represents total energy of the laser light, and S (cm$^2$) represents an area of a region irradiated with the laser light at a time. It is also preferred that irradiation of laser light is repeated, in the laser annealing chamber, with the laser light having such energy that is being increased along with the lapse of the steps. Alternatively, film formation is repeated, in the film formation chamber, to form a semiconductor thin film having such a thickness that is being decreased along with the lapse of the steps.

According to the third aspect of the invention, when the prescribed area of the semiconductor thin film is irradiated with laser light having the prescribed cross sectional area to convert the amorphous material or the polycrystalline material having a relatively small particle diameter to the polycrystalline material having a relatively large particle diameter, the film forming step and the laser annealing step are alternately repeated without exposing the substrate to the air, so as to accumulate the semiconductor thin films. Since the semiconductor thin film formed on the substrate is immediately subjected to laser annealing without exposing to the air, the productivity is improved, and contamination of the surface of the semiconductor thin film due to the air is avoided. Furthermore, by alternately repeating the film forming step and the laser annealing step to accumulate the semiconductor thin films, a semiconductor thin film having an extremely good crystallinity can be finally obtained.

In order to attain the objects of the invention, the following means has been conducted as a fourth aspect. That is, the fourth aspect of the invention relates to a process for producing a semiconductor thin film comprising a film forming step of forming a non-single crystal semiconductor thin film on a surface of a substrate, and an annealing step of irradiating the non-single crystal semiconductor thin film with laser light to convert to a polycrystalline material, wherein the annealing step is conducted in such a manner that the semiconductor thin film is irradiated once or more with a pulse of laser light having a constant cross sectional area and an emission time width from upstand to downfall of 50 ns or more, so as to convert the semiconductor thin film contained in an irradiated area corresponding to the cross sectional area to a polycrystalline material at a time, and an energy intensity of the laser light from upstand to downfall is controlled to apply a desired change. It is preferred that the annealing step has an inclined change in that an energy intensity at downfall is smaller than an energy intensity at upstand. Alternatively, the annealing step may have an inclined change in that an energy intensity at downfall is larger than an energy intensity at upstand. It is also preferred that when an energy density of the laser light is controlled to apply a desired change, a changing width thereof is 300 mJ/cm$^2$ or less. It is also preferred that the annealing step comprises shaping a rectangular shape of laser light having a cross sectional area of 100 cm$^2$ or more. The fourth aspect of the invention also relates to a laser irradiation apparatus for irradiating a semiconductor thin film comprising an amorphous material or a polycrystalline material having a relatively small particle diameter formed on a substrate with laser light to convert into a polycrystalline material having a relatively large particle diameter, which comprises a laser light source emitting a pulse of laser light having an emission time width from upstand to downfall of 50 ns or more; shaping means for shaping a cross sectional area of the laser light to a prescribed shape; irradiating means for irradiating the semiconductor thin film at least once with a pulse of the laser light thus shaped, so as to convert the semiconductor thin film contained in an irradiated area corresponding to the cross sectional area to a polycrystalline material at a time; and controlling means for controlling an energy intensity of the laser light from upstand to downfall to apply a desired change. It is preferred that the controlling means applies an inclined change in that an energy intensity at downfall is smaller than an energy intensity at upstand. Alternatively, the controlling means may apply an inclined change in that an energy intensity at downfall is larger than an energy intensity at upstand. It is also preferred that when an energy density of the laser light is controlled to apply a desired change, a changing width thereof is 300 mJ/cm$^2$ or less. It is also preferred that the shaping means comprises shaping the laser light having a cross sectional area of 100 cm$^2$ or more to a rectangular shape.

The fifth aspect of the invention relates to a process for producing a semiconductor thin film comprising a film forming step of forming a non-single crystal semiconductor thin film on a surface of a substrate; and an annealing step of irradiating the non-single crystal semiconductor thin film with laser light to convert the non-single crystal semiconductor thin film to a polycrystalline material, wherein the annealing step is conducted in such a manner that the substrate is irradiated once or more with a pulse of laser light having an emission time width of 50 ns or more and a constant cross sectional area with maintaining the substrate in a non-oxidative atmosphere, so as to convert the semiconductor thin film contained in an irradiated area corresponding to the cross sectional area to a polycrystalline material at a time. It is preferred that the annealing step is conducted in such a manner that the substrate is irradiated with the laser light with maintaining the substrate in the non-oxidative atmosphere comprising vacuum. Alternatively, the annealing step is conducted in such a manner that the substrate is irradiated with the laser light with maintaining the substrate in the non-oxidative atmosphere filled with an inert gas. In this case, the substrate is irradiated with the laser light with maintaining the substrate in the non-oxidative atmosphere filled with an inert gas at an atmospheric pressure or filled with a pressurized inert gas. It is preferred that the annealing step comprises irradiating the substrate with a pulse of laser light having a cross sectional area of 5 cm$^2$ or more. It is also preferred that the annealing step comprises irradiating the substrate with the laser light having an energy intensity controlled to a range of from 400 to 600 mJ/cm$^2$. The fifth aspect of the invention also relates to a laser irradiation apparatus for irradiating a semiconductor thin film comprising an amorphous material or a polycrystalline material having a relatively small diameter formed on a substrate with laser light to convert to a polycrystalline material having a relatively large particle diameter, which comprises a laser light source emitting a pulse of laser light having an emission time width of 50 ns or more; shaping means for shaping a cross sectional area of the laser light to a prescribed shape; maintaining means for maintaining the substrate previously having a semiconductor thin film in a non-oxidative atmosphere; and an irradiating means for irradiating the substrate maintaining in the non-oxidative atmosphere once or more with the pulse of laser light thus shaped, so as to convert the semiconductor thin film contained in an irradiated region corresponding to the cross sectional area to a polycrystalline material at a time. It is preferred that the maintaining means maintains the substrate in a non-oxidative atmosphere filled with an inert gas. It is also preferred that the maintaining means maintains the substrate in a non-oxidative atmosphere filled with an inert gas at an atmospheric pressure or filled with a pressurized inert gas. It is preferred that the shaping means shapes the pulse of laser light to a rectangular shape having a cross sectional area of 5 cm² or more. It is also preferred that the irradiation step comprises irradiating the substrate with the laser light having an energy intensity controlled to a range of from 400 to 600 mJ/cm².

The sixth aspect of the invention relates to a process for producing a semiconductor thin film comprising a film forming step of forming a non-single crystal semiconductor thin film on a surface of a substrate; and an annealing step of irradiating the non-single crystal semiconductor thin film with laser light to convert the non-single crystal semiconductor thin film to a polycrystalline material, wherein the annealing step is conducted in such a manner that the substrate is irradiated once or more with a pulse of laser light having an emission time width of 50 ns or more and a constant cross sectional area under conditions in that the substrate is uniformly heated, so as to convert the semiconductor thin film contained in an irradiated area corresponding to the cross sectional area to a polycrystalline material at a time. It is preferred that the annealing step comprises irradiating the substrate with laser light with maintaining the substrate in a vacuum atmosphere under conditions in that the substrate is uniformly heated. Alternatively, the annealing step may comprise irradiating the substrate with laser light with maintaining the substrate in an inert gas atmosphere under conditions in that the substrate is uniformly heated. The sixth aspect of the invention also relates to a laser irradiation apparatus for irradiating a semiconductor thin film comprising an amorphous material or a polycrystalline material having a relatively small diameter formed on a substrate with laser light to convert to a polycrystalline material having a relatively large particle diameter, which comprises a laser light source emitting a pulse of laser light having an emission time width of 50 ns or more; shaping means for shaping a cross sectional area of the laser light to a constant shape; heating means for uniformly heating the substrate previously having a semiconductor thin film; and irradiating means for irradiating the heated substrate once or more with the pulse of laser light thus shaped, so as to convert the semiconductor thin film contained in an irradiated region corresponding to the cross sectional area to a polycrystalline material at a time. It is preferred that the heating means comprises uniformly heating the substrate comprising glass to a range of from 300 to 450° C. It is also preferred that the heating means comprises a heat source built in a stage, on which the substrate is placed. It is also preferred that the heating means heats the substrate with maintaining the substrate in a vacuum atmosphere. Alternatively, the heating means may heat the substrate with maintaining the substrate in an inert gas atmosphere.

The seventh aspect of the invention relates to a process for producing a semiconductor thin film comprising a film forming step of forming a non-single crystal semiconductor thin film on a surface of a substrate; and an annealing step of irradiating the non-single crystal semiconductor thin film with laser light to convert the non-single crystal semiconductor thin film to a polycrystalline material, wherein the annealing step is conducted in such a manner that the substrate is irradiated once or more with a pulse of laser light having an emission time width of 50 ns or more and a constant cross sectional area under conditions in that the substrate is cooled to a temperature lower than room temperature, so as to convert the semiconductor thin film contained in an irradiated area corresponding to the cross sectional area to a polycrystalline material at a time. It is preferred that in the annealing step, cooling is conducted at a substrate temperature lower by 50° C. or more than the substrate temperature increased by irradiation with laser light. It is more preferred that in the annealing step, cooling is conducted at a substrate temperature lower by 100° C. or more than the substrate temperature increased by irradiation with laser light. It is also preferred that the annealing step comprises irradiating the semiconductor thin film with a pulse of laser light having a cross sectional area of from 10 to 100 cm². The seventh aspect of the invention also relates to a laser irradiation apparatus for irradiating a semiconductor thin film comprising an amorphous material or a polycrystalline material having a relatively small diameter formed on a substrate with laser light to convert to a polycrystalline material having a relatively large particle diameter, which comprises a laser light source emitting a pulse of laser light having an emission time width of 50 ns or more; shaping means for shaping a cross sectional area of the laser light to a constant cross sectional area; cooling means for cooling the substrate previously having a semiconductor thin film to a temperature lower than room temperature; and an irradiating means for irradiating the cooled substrate once or more with the pulse of laser light thus shaped, so as to convert the semiconductor thin film contained in an irradiated region corresponding to the cross sectional area to a polycrystalline material at a time. It is preferred that the cooling means cools the substrate to a temperature lower by 50° C. or more than the substrate temperature increased by irradiation with laser light. It is more preferred that the cooling means cools the substrate to a temperature lower by 100° C. or more than the substrate temperature increased by irradiation with laser light.

According to the fourth aspect of the invention, in the laser irradiating apparatus for producing a polycrystalline semiconductor thin film comprising, for example, polycrystalline silicon on an insulating substrate comprising, for example, transparent glass, reformation of the polycrystalline semiconductor thin film is conducted by changing the energy intensity of the laser light during the time from the start of irradiation to the end of the irradiation. According to the fifth aspect of the invention, in the crystallization step of the semiconductor thin film comprising, for example, polycrystalline silicon to be an active layer of a thin film transistor, irradiation of laser light is conducted in a vacuum atmosphere or in an inert gas atmosphere. At this time, irradiation is conducted once or more on the same part by using excimer laser light of high output having an emission time of 50 ns or more and an irradiation area of 5 cm² or more, so as to conduct crystal growth of the polycrystalline silicon thin film. The bulk irradiation with laser light of high output is conducted in a non-oxidative atmosphere shielded from oxygen to previously prevent the formation of crystal defects. According to the sixth aspect of the invention, in the laser irradiation apparatus capable of crystallizing an irradiation region more than the certain area at a time, a substrate heating mechanism is attached to improve the uniformity of the characteristics and to improve the productivity. Furthermore, the substrate heating mechanism is maintained in vacuum or in an inert gas. When the substrate is heated on irradiating with laser light of high output, the uniformity of the crystals is improved, and the productivity is also improved. According to the seventh aspect of the invention, when a polycrystalline semiconductor thin film is produced, the temperature of the substrate is cooled to 10° C. or less on crystallizing at a time by irradiating laser light of high output with an irradiation area, for example, of from 10 to 100 cm². By controlling the temperature of the substrate in such manners, a uniform polycrystalline semiconductor thin film with suppressed dispersion can be obtained although the crystalline particle diameter is not increased.

The invention is not limited to each of the effects of the individual aspects, but is effective when the beam profile of the laser light is changed and adjusted with respect to space and time. At this time, the laser light irradiation may be conducted without exposing to the air.

DESCRIPTION OF THE PREFERRED EMBODIMENTS

Figure 3:
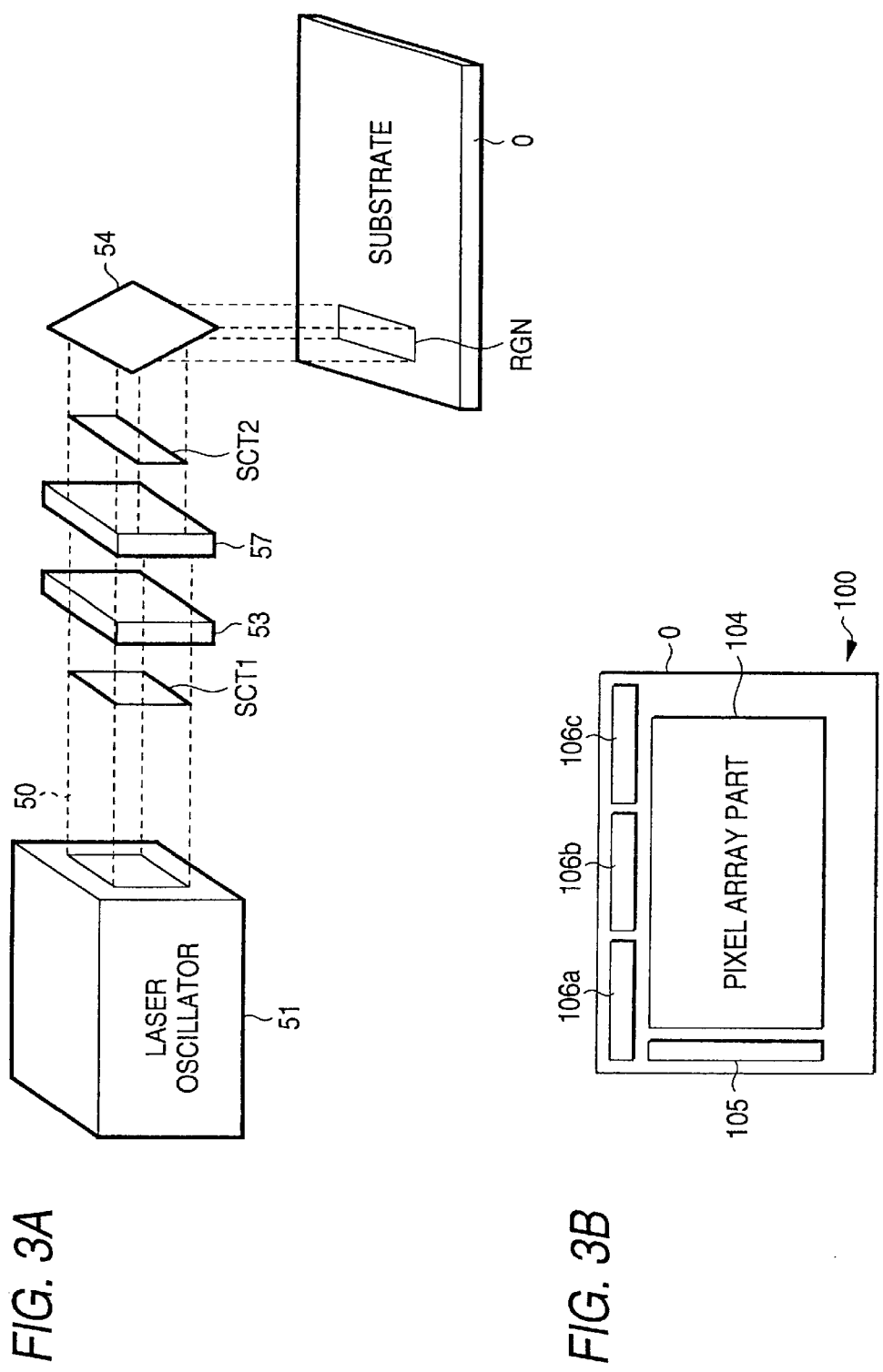
FIGS. 3A and 3B are schematic diagrams showing the process for producing a thin film semiconductor device according to the invention and a laser irradiation apparatus used therefor.

The invention will be described in detail with reference to the drawings. FIGS. 3A and 3B are schematic diagrams showing the process for producing a thin film semiconductor device according to the invention and a laser irradiation apparatus used therefor. FIG. 3A shows the laser irradiation apparatus, and FIG. 3B shows the thin film semiconductor device. The laser irradiation apparatus comprises a laser oscillator 51, which intermittently emits laser light 50 having a prescribed cross sectional shape SCT1. The energy distribution of the laser light 50 is made uniform in a homogenizer part 53, and then the cross sectional shape thereof can be adjusted to SCT2 by an adjustable diaphragm 57. The adjustable diaphragm 57 may comprise a mechanical shutter or an optical light valve. In the case where an optical light valve is used, not only the cross sectional shape SCT2 of the laser light 50 but also the energy distribution thereof can be adjusted. After passing through the adjustable diaphragm 57, the laser light 50 is reflected by a reflection mirror 54 at a right angle, and incident on a prescribed region RGN of a substrate 0 at a time as an object of the treatment. This bulk irradiation at a time is conducted at least once, and in some cases, it may be conducted plural times on the same part. The output level of the laser oscillator 51 itself may be changed with respect to time by changing the resistance and capacitance.

As shown in FIG. 3B, the thin film semiconductor device 100 in a finished state comprises an insulating substrate 0 having thereon a pixel array part 104, a vertical scanner 105, and horizontal scanners 106a to 106c. Therefore, in this embodiment, the thin film semiconductor device 100 is used as a driving substrate of an active matrix type display device. However, the invention is not limited to this embodiment, but any device, in which thin film transistors are integrated and formed in a prescribed region to form a circuit, is generally called as a thin film semiconductor device 100.

In order to produce the thin film semiconductor device 100 shown in FIG. 3B by using, for example, the laser irradiation apparatus shown in FIG. 3A, the following steps are conducted. The film forming step is firstly conducted to form a semiconductor thin film comprising. an amorphous material or a polycrystalline material having a relatively small particle diameter on the insulating substrate 0. The irradiation step is then conducted to irradiate the semiconductor thin film with the laser light 50 to convert the amorphous material or the polycrystalline material having a relatively small particle diameter to a polycrystalline material having a relatively large particle diameter. In this embodiment, while the laser light 50 is used as the energy beam, an electron beam, for example, may be used instead of the laser beam. Thereafter, the forming step is conducted to integrate and form a thin film transistor in a prescribed region by using the polycrystallized semiconductor thin film as an active layer. In this embodiment, thin film transistors are integrated and formed in the regions, such as the pixel array part 104, the vertical scanner 105 and the horizontal scanners 106a to 106c. It should be noted that in the irradiation step, the cross sectional shape SCT2 of the laser light 50 is changed and adjusted with respect to the region RGN to be an object of irradiation with the adjustable diaphragm 57, and the region RGN is irradiated once or more at a time to make the characteristics of the thin film transistor uniform. Under the conditions shown in the figure, irradiation of the laser light 50, which is adjusted to the cross sectional shape SCT2 corresponding to the region RGN, on which the vertical scanner 105 is to be integrated and formed. According to the step, the semiconductor thin film with the region RGN is uniformly polycrystallized, so as to obtain uniform device characteristics by forming thin film transistor using the semiconductor thin film as an active layer, and as a result, the vertical scanner 105 of high performance can be formed. The same is applicable to the horizontal scanners 106a, 106b and 106c. The horizontal scanner in this embodiment is divided into three pieces, and each of the horizontal scanners are irradiated with the laser light 50 having the cross sectional shape adjusted to the respective pieces of the horizontal scanners. However, the invention is not limited to this embodiment, but in the case where the horizontal scanner is constituted with a single piece, the cross sectional shape of the laser light 50 is adjusted to that region, and bulk irradiation is conducted at a time. The bulk irradiation of the prescribed region is conducted to make uniform the threshold value characteristics of the thin film transistors formed in the region. According to the procedures, it becomes possible that an operational amplifier circuit, an analog/digital conversion circuit, a digital/analog conversion circuit, a level shifter circuit, a memory circuit, and a microprocessor circuit, which have been difficult to be formed, can be integrated and formed on the insulating substrate 0.

Figure 4:
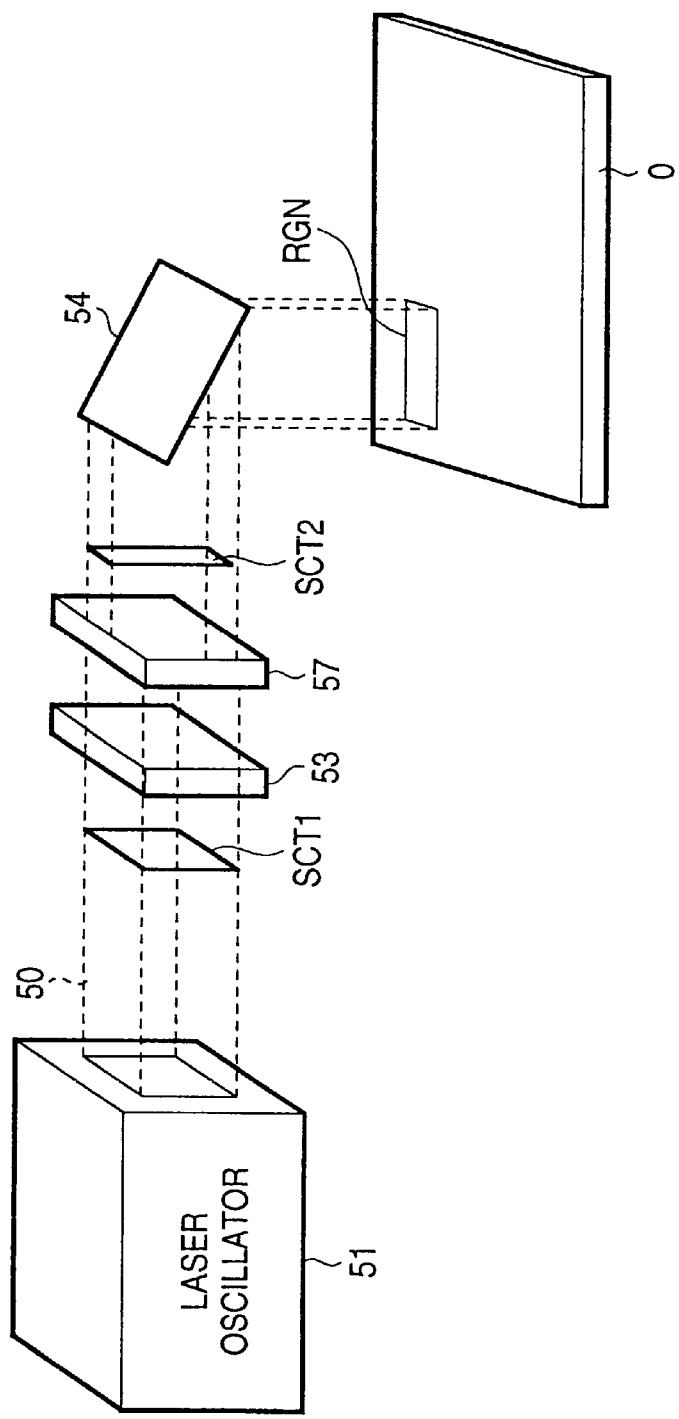
FIG. 4 shows the state of the laser irradiation apparatus shown in FIGS. 3A and 3B upon use.

FIG. 4 shows the state of the laser irradiation apparatus shown in FIGS. 3A and 3B upon use, in which the original cross sectional shape SCT1 of the laser light 50 is adjusted to SCT2 with the adjustable diaphragm 57, so as to overlap the region RGN corresponding to the horizontal scanner 106a shown in FIG. 3B. The bulk irradiation of the remaining horizontal scanners 106b and 106c can be conducted at a time in the same manner. As described in the foregoing, the laser irradiation apparatus according to the invention is used to convert a semiconductor thin film comprising an amorphous material or a polycrystalline material having a relatively small particle diameter formed on the substrate 0 to a polycrystalline material having a relatively large particle diameter by irradiating with laser light 50. The laser irradiation apparatus comprises a laser light source (the laser oscillator 51) emitting the laser light 50 having a prescribed cross sectional shape SCT1; shaping means (the adjustable diaphragm 57) changing and adjusting the cross sectional shape SCT1 of the laser light 50 corresponding to the prescribed region RGN; and irradiation means (such as the reflection mirror 54) for irradiating the semiconductor thin film with the laser light 50, the cross sectional shape of which is shaped to SCT2, so as to convert uniformly the amorphous material or the polycrystalline material having a relatively small particle diameter within the region RGN to a polycrystalline material having a relatively large particle diameter at a time.

Figure 1A:
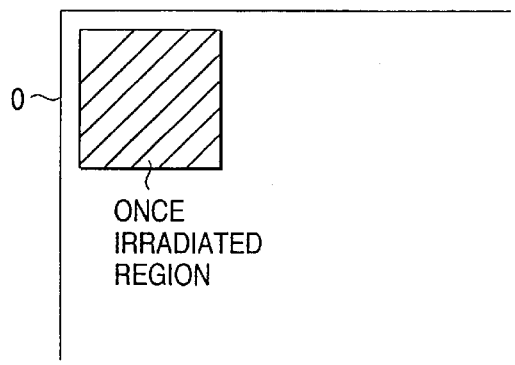
FIGS. 1A to 1C is a diagram schematically showing the conventional laser irradiation treatment.
Figure 1B:
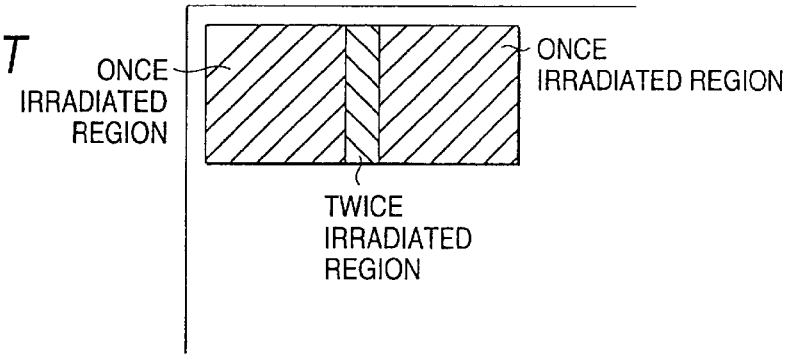
Figure 1C:
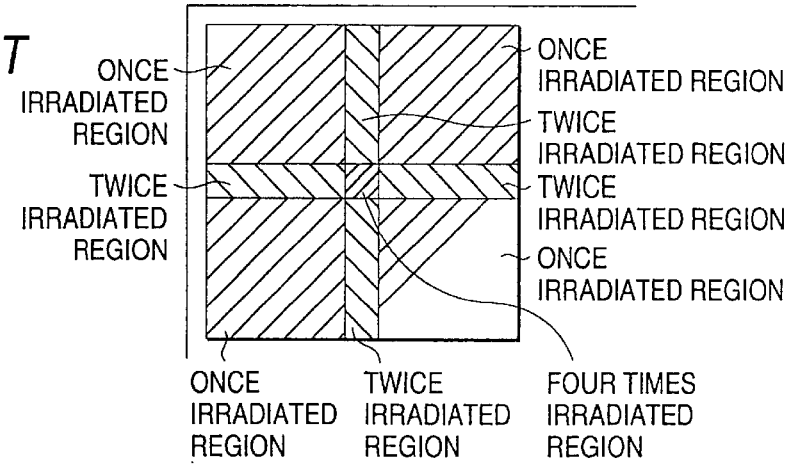
Figure 2:
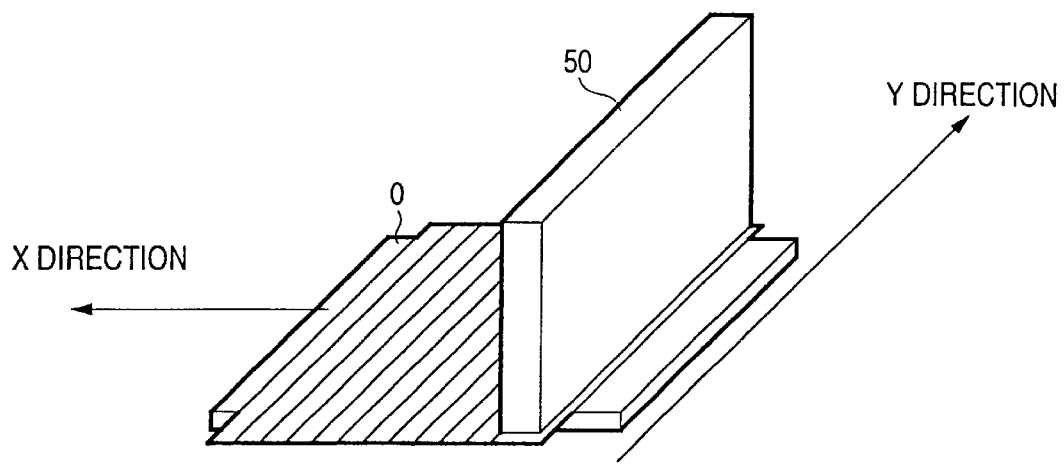
FIG. 2 is a diagram schematically showing scanning of the conventional linear laser beam.

In a practical active matrix type display device formed by integrating and forming polycrystalline silicon thin film transistors, the region practically requiring to have high level uniformity is the driving circuit part (the vertical scanner 105 and the horizontal scanners 106a to 106c) in the periphery of the pixel array part 104 as shown in FIG. 3B. Therefore, the cross sectional shape of the laser light 50 is shaped to the shape of the driving circuit part, which is crystallized thereby at a time, and thus a device having high uniformity can be produced even by using a laser irradiation apparatus having a small total output energy. For example, in the case of a laser irradiation apparatus having a total output energy of 10 J, it is preferred that in the region (20 cm×1 cm) where the uniformity of the vertical scanner 105 is required, the cross sectional shape of the laser light 50 is controlled as shown in FIG. 3A, and in the region (2 cm×10 cm) where the uniformity of the horizontal scanners 106a to 106c is required, the cross sectional shape of the laser light 50 is shaped as shown in FIG. 4. In the region where the high level uniformity is not required, such as the pixel array part 104, scanning of a conventional linear laser beam of 20 cm×0.06 cm can be conducted as shown in FIG. 2.

Figure 5:
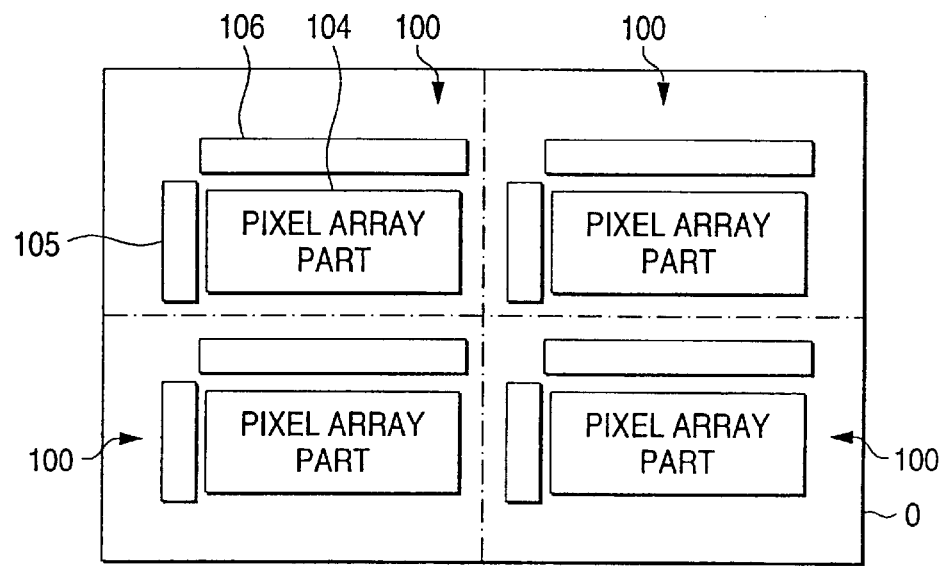
FIG. 5 shows an example where four thin film semiconductor devices are formed on a relatively large insulating substrate.
Figure 6:
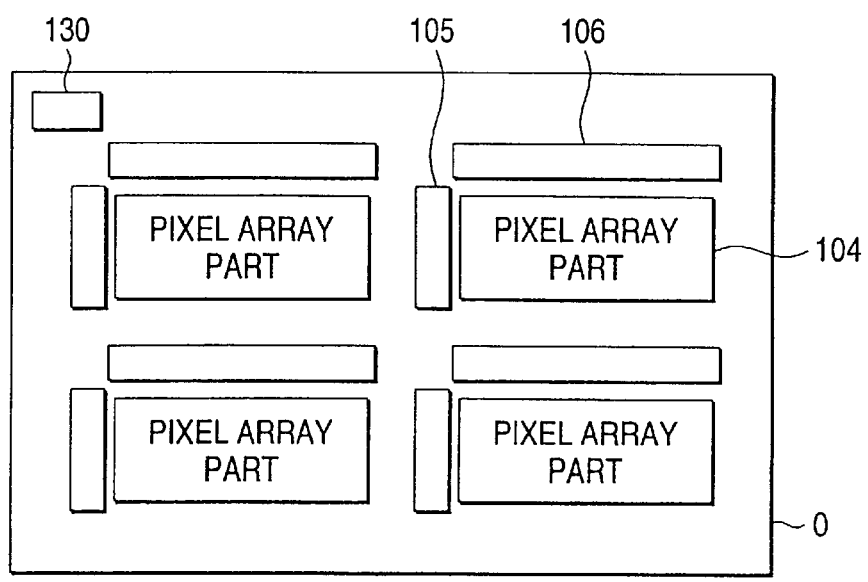
FIG. 6 shows an example where a thin film semiconductor device is formed on a substrate, in which an information code is written.

FIG. 5 shows an example where four thin film semiconductor devices 100 are integrated and formed on a relatively large insulating substrate 0. In this example, four pieces of the devices can be obtained from one substrate. In general, the regions requiring high level uniformity are different depending on the size and the specification of the products as shown in FIG. 5, and therefore it is preferred that the cross sectional shape of the laser light is changed and adjusted corresponding to the respective products.

In order to control the cross sectional shape of the laser light to different shapes depending on the size and the specification of the products, it is preferred that the laser irradiation apparatus comprises a mechanism for reading an information code 130. The information code 130 is previously written on a part of the insulating substrate 0. In some cases, a mechanism for recognizing the pattern within the insulating substrate 0 may be provided instead of the mechanism for reading the information code 130. The laser irradiation apparatus according to the invention converts a semiconductor thin film comprising an amorphous material or a polycrystalline material having a relatively small particle diameter formed on an insulating substrate 0 capable of carrying information for processing to a polycrystalline material having a relatively large particle diameter by irradiating with laser light. At this time, at least one condition selected from the cross sectional shape, the irradiating position, the energy amount, the energy distribution and the moving direction of the laser light is capable of being adjusted by reading the information. Specifically, the information code 130 written on the substrate 0 is detected to read the information for processing. Alternatively, the pattern formed on the surface of the substrate 0 may be recognized to read the information for processing. The pattern specifically includes the shapes of the vertical scanner 105, the horizontal scanner 106 and the pixel array part 104.

Figure 7A:
FIGS. 7A to 7D are process diagrams showing the process for producing a thin film transistor utilizing the laser irradiation apparatus according to the invention.

FIGS. 7A to 7D are process diagrams showing the process for producing a thin film transistor utilizing the laser irradiation apparatus according to the invention. In this embodiment, a process for producing a thin film transistor having a bottom gate structure will be shown. As shown in FIG. 7A, a film of Al, Ta, Mo, W, Cr, Cu or an alloy thereof having a thickness of from 100 to 200 nm is formed on an insulating substrate 0 comprising, for example, glass, and then patterned to form a gate electrode 1.

Figure 7B:
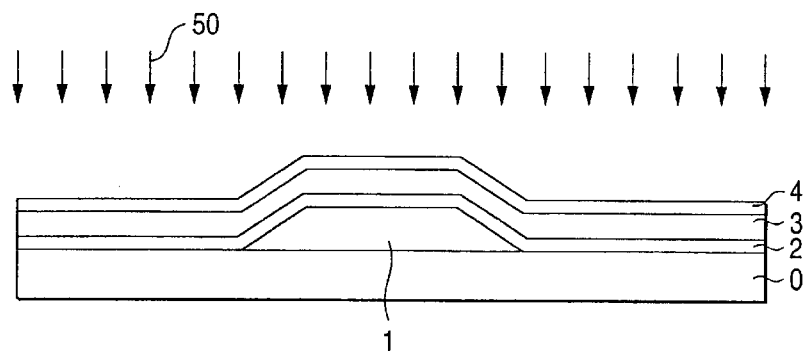

Thereafter, as shown in FIG. 7B, a gate insulating film is formed on the gate electrode 1. In this example, the gate insulating film has, for example, a two-layer structure comprising a gate nitride film 2 ($SiN_x$) and a gate oxide film 3 ($SiO_2$). The gate nitride film 2 is formed with a mixture of a $SiH_4$ gas and a $NH_3$ gas as a raw material gas by, for example, a plasma CVD (PCVD) method. A normal pressure CVD method and a reduced pressure CVD method may be employed instead of the plasma CVD method. In this embodiment, the gate nitride film 2 is accumulated to have a thickness of 50 nm. Subsequent to the formation of the gate nitride film 2, the gate oxide film 3 is continuously formed to have a thickness, for example, of 200 nm. Furthermore, on the gate oxide film 3, a semiconductor thin film 4 comprising amorphous silicon is continuously formed to have a thickness of from 30 to 80 nm. The gate insulating film having the two-layer structure and the amorphous semiconductor thin film 4 are continuously formed without breaking vacuum of the film forming chamber. In the case where the plasma CVD method is used for forming these films, a heat treatment, for example, in a nitrogen atmosphere at 400 to 450° C. for about 1 hour is conducted, so as to release hydrogen contained in the amorphous semiconductor thin film 4, i.e., so-called dehydrogenation annealing is conducted. The amorphous semiconductor thin film 4 is irradiated with the laser light 50 to conduct crystallization. As the laser light 50, an excimer laser beam can be employed. According to the first aspect of the invention, the cross sectional shape of the laser light 50 is changed and adjusted to a prescribed circuit region, and bulk irradiation of the region is conducted once or more at a time to be crystallized, so as to realize uniformity of the characteristics of the thin film transistors.

Figure 7C:
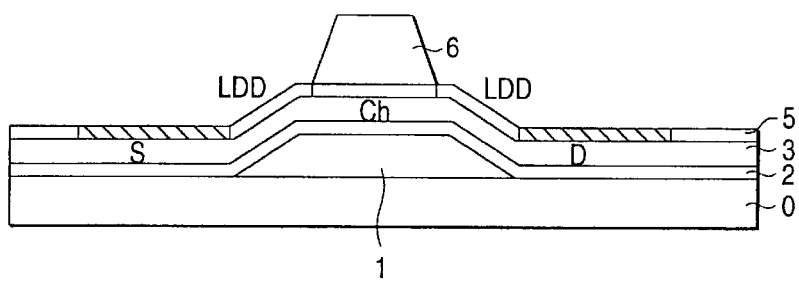

As shown in FIG. 7C, on the polycrystalline semiconductor thin film 5 having been crystallized in the preceding step, a film of $SiO_2$ is formed, for example, by a plasma CVD method to have a thickness, for example, of from about 100 to 300 nm. The $SiO_2$ film is then patterned to a prescribed shape to form a stopper film 6. In this case, the stopper film 6 is patterned to align the gate electrode 1 by employing, for example, a back surface exposure technique. A part of the polycrystalline semiconductor thin film 5 immediately under the stopper film 6 is protected as a channel region Ch. Subsequently, an impurity (such as a $P^+$ ion) is implanted into the semiconductor thin film 5, for example, by ion doping, using the stopper film 6 as a mask, so as to form an LDD region. The dose amount at this time is, for example, from $6 \times 10^{12}$ to $5 \times 10^{13}$ atoms/cm$^2$. After a photoresist film is formed and patterned to cover the stopper film 6 and the LDD region on the sides of the stopper film 6, an impurity (such as $P^+$ ion) is implanted at a high concentration using as a mask, so as to form a source region S and a drain region D. For the implantation of the impurity, ion doping, for example, may be employed. In the ion doping, the impurity is implanted by acceleration of an electric field without mass separation, and in this embodiment, the impurity is implanted at a dose amount, for example, of $1 \times 10^{15}$ atoms/cm$^2$, to form the source region S and the drain region D. While not shown in the figure, in the case where a P channel type thin film transistor is produced, after covering the region of the N channel type thin film transistor with a photoresist, ion doping is conducted by changing the impurity from a $P^+$ ion to a $B^+$ ion with a dose amount, for example, of about $1 \times 10^{15}$ atoms/cm$^2$. Thereafter, the impurity implanted in the polycrystalline semiconductor thin film 5 is activated. For example, laser activation annealing using an excimer laser light source is conducted. That is, the glass substrate 0 is irradiated with scanning pluses of excimer laser to activate the impurity implanted in the polycrystalline semiconductor thin film 5.

Figure 7D:
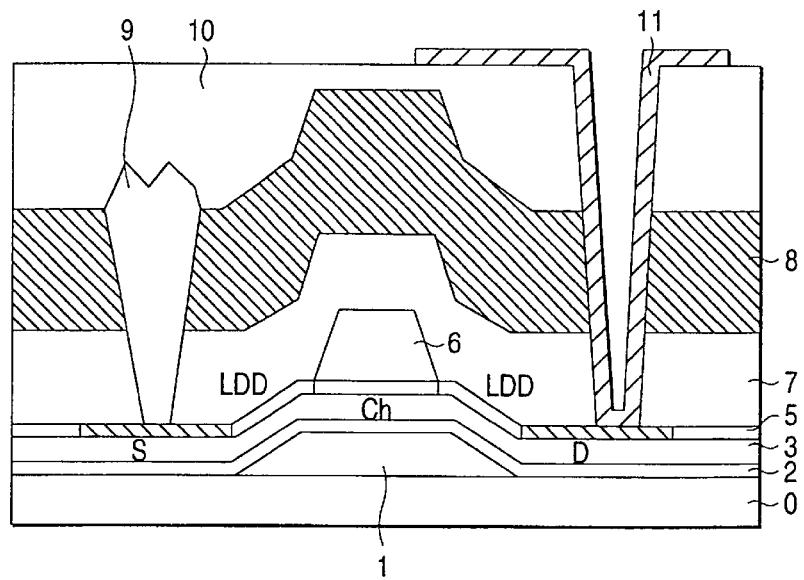

Finally, as shown in FIG. 7D, a film of $SiO_2$ having a thickness of about 200 nm, for example, is formed to be an interlevel insulating layer 7. After forming the interlevel insulating film 7, a film of $SiN_x$ is formed by a plasma CVD method to have a thickness, for example, of about from 200 to 400 nm to be a passivation film (cap film) 8. In this stage, a heat treatment at about 350° C. for 1 hour is conducted in a nitrogen gas or a forming gas or in a vacuum atmosphere, to diffuse hydrogen atoms contained in the interlevel insulating film 7 into the semiconductor thin film 5. Thereafter, contact holes are formed, and after forming a film of Mo or Al, for example, having a thickness of from 200 to 400 nm by sputtering, the film is patterned to a prescribed shape to make a wiring electrode 9. Furthermore, a flattening layer 10 comprising, for example, an acrylic resin is coated to a thickness of about 1 μm, and the contact holes are formed. After sputting a transparent conductive film comprising, for example, ITO or IXO on the flattening layer 10, it is then patterned to a prescribed shape to make a pixel electrode 11.

Figure 8:
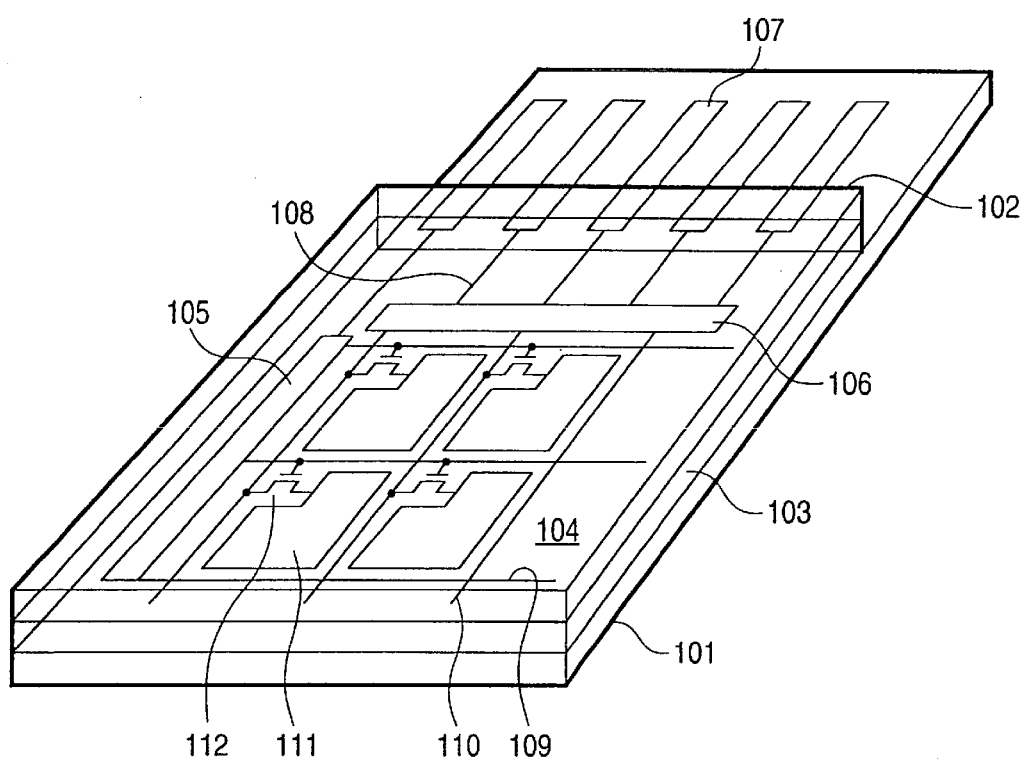
FIG. 8 is a schematic perspective view showing an example of an active matrix type display device using the thin film semiconductor device produced according to the invention.

An example of an active matrix type display device using the thin film semiconductor device produced according to the invention as a driving substrate will be described with reference to FIG. 8. As shown in the figure, the display device has a panel structure comprising a pair of insulating substrates 101 and 102, and an electrooptical substance 103 maintained between the substrates. As the electrooptical substance 103, a liquid crystal material and an organic electroluminescence material are used. The lower insulating substrate 101 has a pixel array part 104 and a driving circuit part integrated and formed thereon. The driving circuit part is divided into a vertical scanner 105 and a horizontal scanner 106. A terminal part 107 for connecting to the outside is formed on the upper end of the periphery of the insulating substrate 101. The terminal part 107 is connected to the vertical scanner 105 and the horizontal scanner 106 through wiring 108. On the pixel array part 104, gate wiring 109 having a line shape and signal wiring 110 having a column shape are formed. On the point of intersection of the gate wiring and the signal wiring, a pixel electrode 111 and a thin film transistor 112 driving the pixel electrode are formed. A gate electrode of the thin film transistor 112 is connected to the corresponding gate wiring 109, a drain region thereof is connected to the corresponding pixel electrode 111, and a source region thereof is connected to the corresponding signal wiring 110. The gate wiring 109 is connected to the vertical scanner 105, and the signal wiring 110 is connected to the horizontal scanner 106. The region of the vertical scanner 105 includes the thin film transistor integrated and formed on the polycrystalline semiconductor thin film that has been made uniform by bulk irradiation with laser light. The same is applied to the horizontal scanner 106.

Figure 9:
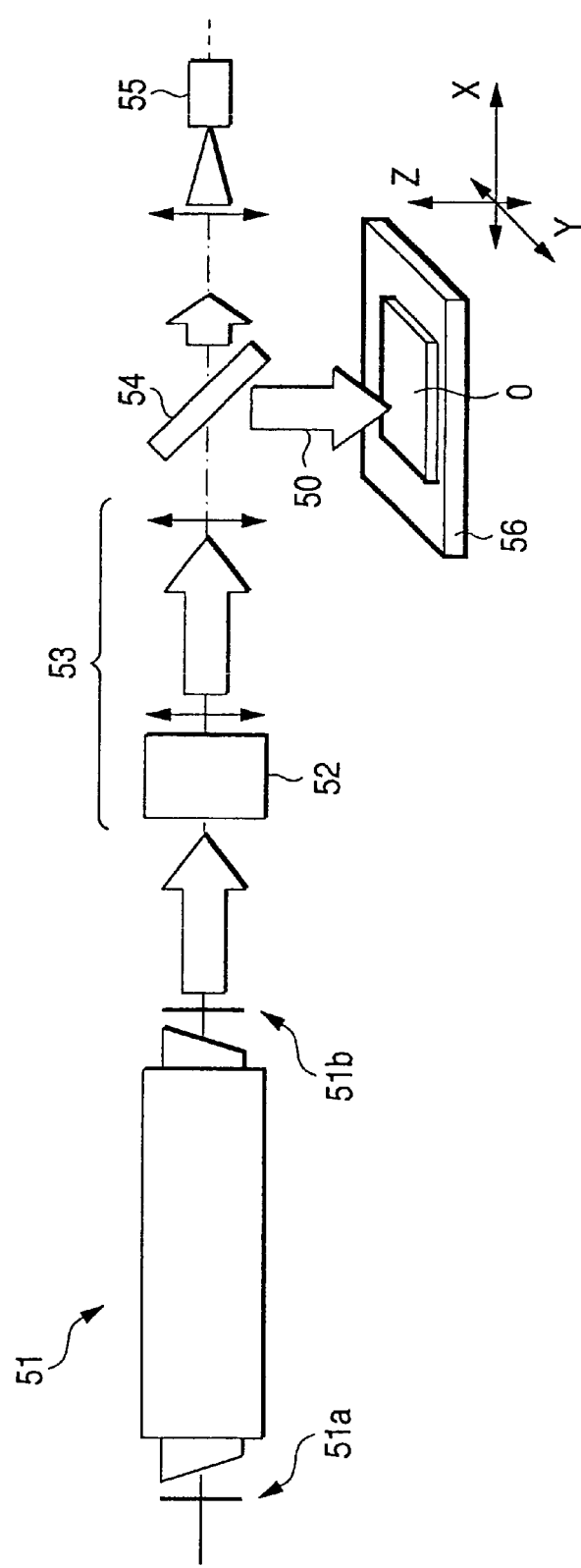
FIG. 9 is a block diagram showing a basic structure of a laser irradiation apparatus according to the second aspect of the invention.

FIG. 9 is a block diagram showing a basic structure of a laser irradiation apparatus according to the second aspect of the invention. In the laser irradiation apparatus, laser light 50 having a wavelength of 308 nm emitted from a laser oscillator 51 is amplified by a pair of laser reflectors 51a and 51b, and then shaped and homogenized by a homogenizer part 53 including a fly-eye lens 52. Thereafter, the laser light 50 is reflected by a reflector 54 at a right angle, and incident on an insulating substrate 0 as an object of the treatment. The insulating substrate 0 is carried on a stage 56 that can be moved stepwise in the X direction and the Y direction as shown in the figure, and can be moved to a prescribed distance synchronizing with the pulse emission of the laser light 50. The energy level of the laser light 50 is controlled through an energy measurement probe 55.

Figure 10:
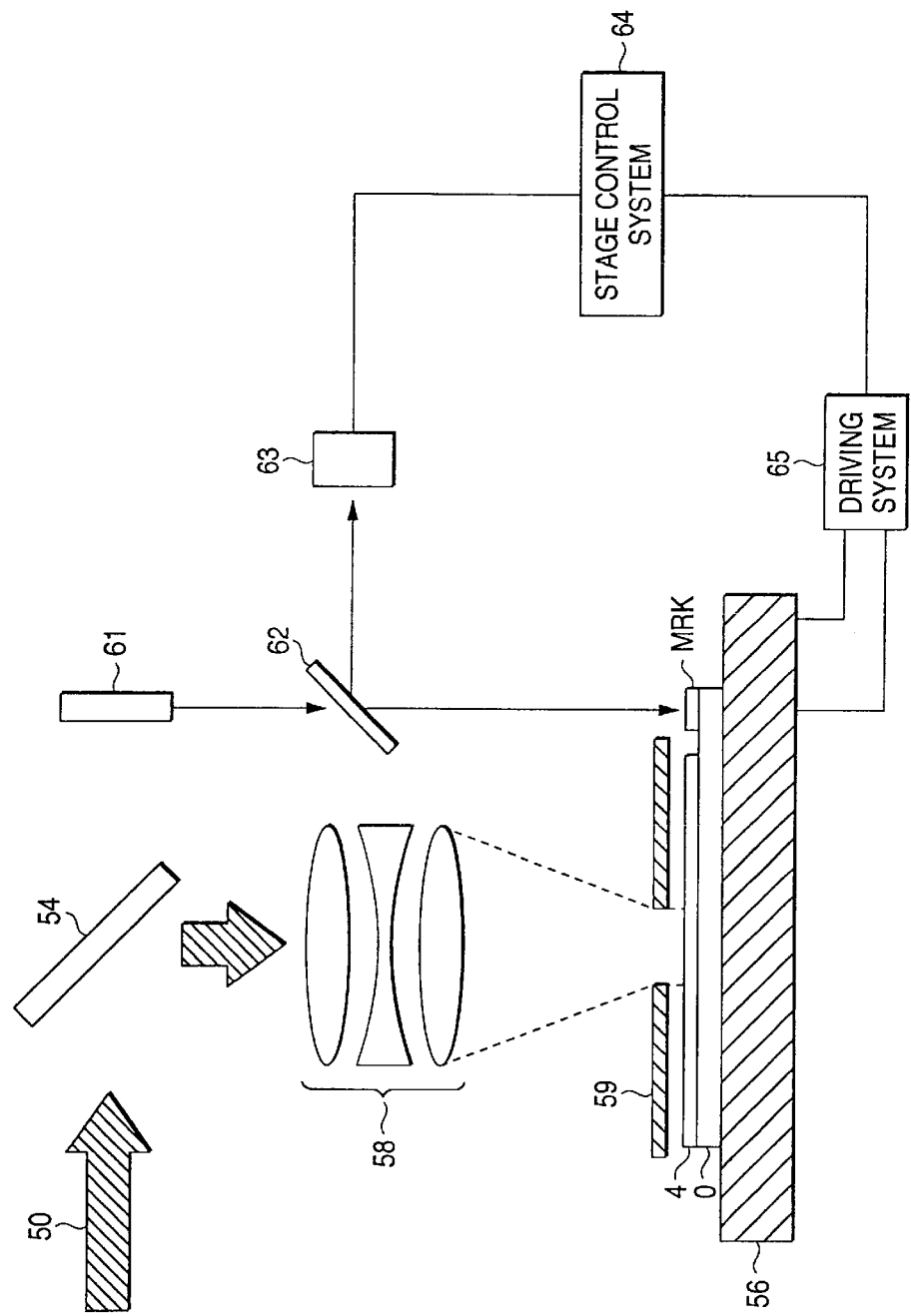
FIG. 10 is a block diagram showing the characteristic part in the laser irradiation apparatus shown in FIG. 9.

FIG. 10 is a block diagram showing the characteristic part in the laser irradiation apparatus shown in FIG. 9 that is not specifically shown in FIG. 9. In particular, the constitution of downstream with respect to the reflector 54 is indicated. As shown in the figure, the cross sectional shape of the laser light 50 reflected at a right angle by the reflector 54 can be freely enlarged or reduced by an optical system 58. Furthermore, a rectangular irradiation region can be formed with an accuracy of 1 μm or less by a light shielding plate (blade) 59 provided immediately above the substrate 0 to be treated. There is no principle problem when the optical system 58 for enlargement and reduction is provided on the upstream side of the reflector 54. A detector 63 is arranged to read accurately a mark MRK separately provided on the substrate 0, and the position of the insulating substrate 0 carried on the stage 56 is measured with an accuracy of 1 μm or less. The mark MRK is irradiated with illuminant light emitted from an illuminant light source 61 through a half mirror 62. Positional data of the insulating substrate 0 obtained from the detector 63 are subjected to feedback to a stage controlling system 64, and thus the position of the irradiation region of the semiconductor thin film 4 formed on the insulating substrate 0 can be accurately determined.

Figure 11:
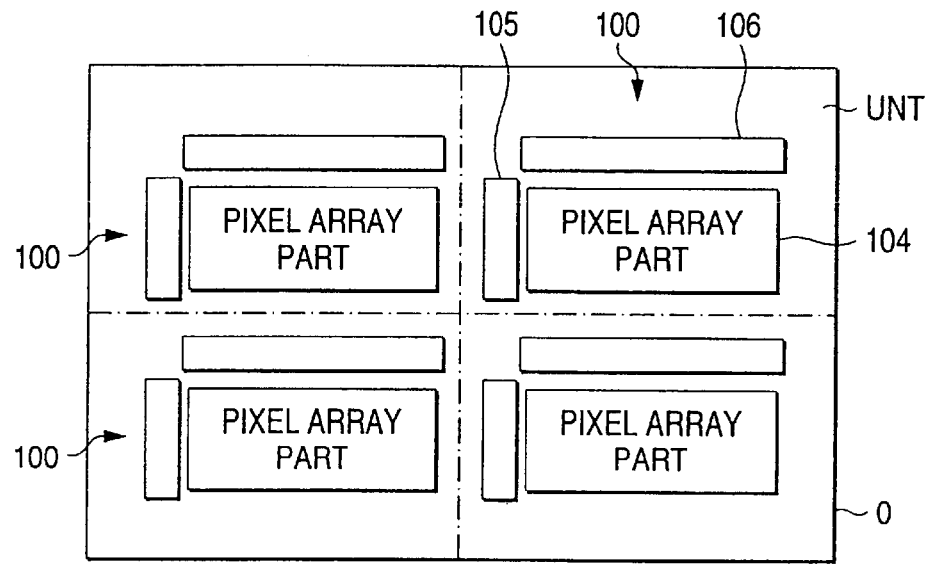
FIG. 11 is a plan view showing a using method of the laser irradiation apparatus shown in FIGS. 9 and 10.

FIG. 11 is a plan view showing a using method of the laser irradiation apparatus shown in FIGS. 9 and 10. In this embodiment, four thin film semiconductor devices 100 are formed on the insulating substrate 0. The film forming step is firstly conducted to form a semiconductor thin film comprising an amorphous material or a polycrystalline material having a relatively small particle diameter on the substrate 0, on which plural units UNT (four in this embodiment) are designated. The irradiation step is then conducted to irradiate intermittently the semiconductor thin film with laser light moving with respect to the substrate 0, so as to convert the amorphous material or the polycrystalline material having a relatively small particle diameter to a polycrystalline material having a relatively large particle diameter. Thereafter, thin film transistors are integrated and formed by using the polycrystallized semiconductor thin film as an active layer, to form the thin film semiconductor device 100 on the respective units UNT. In this embodiment, each of the thin film semiconductor devices contains a pixel array part 104, a vertical scanner 105 and a horizontal scanner 106. It should be noted that in the irradiation step, the cross sectional shape of the laser light is changed and adjusted with respect to the unit UNT, and one or two or more of the units UNT are irradiated at a time.

Figure 12:
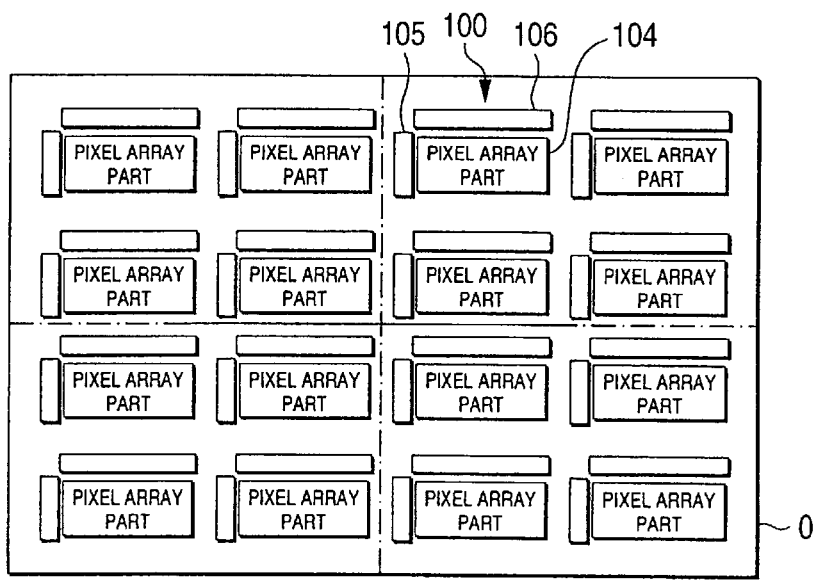
FIG. 12 is a schematic diagram showing another using method of the laser irradiation apparatus according to the invention.

FIG. 12 is a schematic diagram showing another using method of the laser irradiation apparatus according to the invention. While each one of the unit is separately irradiated with laser light in the embodiment shown in FIG. 11, the four units are irradiated at a time in the embodiment shown in FIG. 12. As described in the foregoing, by using the laser irradiation apparatus according to the invention, it is possible that, in the case where the unit or the size of the thin film semiconductor device is small, the laser irradiation region is determined for plural thin film semiconductor device units with high accuracy, and thus crystallization excellent in uniformity is realized. Even in the case where separate irradiation is necessarily conducted, for example, in a large scale panel that cannot be annealed at a time due to the difficulty in irradiation energy, crystallization annealing with substantially no boundary part can be realized by making full use of the high accuracy positioning.

The constitution of the laser irradiation apparatus according to the invention will be described again with reference to FIGS. 9 and 10. In the laser irradiation apparatus, the semiconductor thin film 4 comprising an amorphous material or a polycrystalline material having a relatively small particle diameter formed on the substrate 0, on which the units has been previously designated, is intermittently irradiated with the laser light 50 moving with respect to the substrate, so as to convert into a polycrystalline material having a relatively large particle diameter. The laser irradiation apparatus comprises a laser light source (laser oscillator 51) intermittently emitting the laser light 50; an optical system 58 enlarging or reducing the cross sectional shape of the laser light 50 corresponding to the unit UNT; and shielding means (shielding plate 59) for shielding a part other than the unit from the laser light 50, wherein irradiation is conducted by bulk irradiation of one or two or more units at a time by a single shot irradiation. The laser irradiation apparatus comprises moving means (a stage 56 and a driving system 65 therefor), by which the substrate 0 is moved with respect to the laser light 50, and thus all the units are irradiated one by one with the laser light 50. Furthermore, it comprises detecting means (a detector 63) for optically reading a mark MRK for positioning provided on the substrate 0, and controlling means (a stage controlling system 64) for controlling the moving means corresponding to the mark thus read.

Figure 13A:
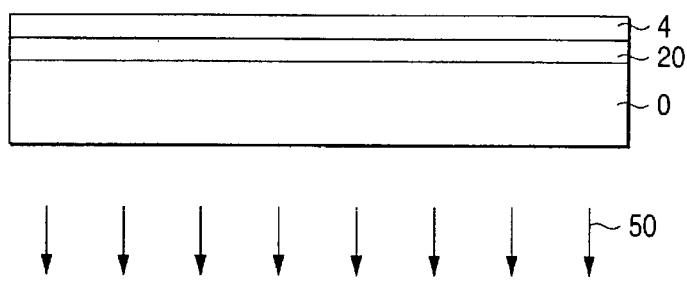
FIGS. 13A and 13B are cross sectional views schematically showing a specific example of a crystallization method of a semiconductor thin film using the laser irradiation apparatus shown in FIGS. 9 and 10.
Figure 13B:
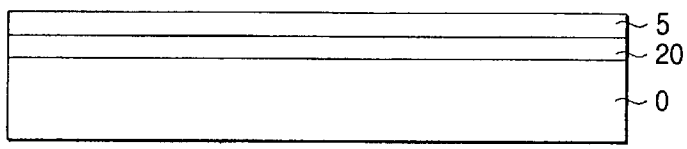

A specific example of a crystallization method of a semiconductor thin film using the laser irradiation apparatus shown in FIGS. 9 and 10 will be described with reference to FIGS. 13A and 13B. As shown in FIG. 13A, the film forming step is firstly conducted to form a semiconductor thin film 4 comprising an amorphous material is formed on a substrate 0, on which a prescribed unit has been designated. In some cases, a semiconductor thin film 4 comprising a polycrystalline material having a relatively small particle diameter may be formed instead of the amorphous material. Preceding the formation of the semiconductor thin film 4, an underlayer film 20 is formed on the surface of the substrate 0 to prevent contamination of the semiconductor thin film 4 due to impurities from the substrate 0. As shown in FIG. 13B, the irradiation step is then conducted to intermittently irradiate the semiconductor thin film with laser light 50 moving with respect to the substrate 0, so as to convert the amorphous material or the polycrystalline material having a relatively small particle diameter to a polycrystalline material having a relatively large particle diameter. Depending on the cases, other energy beams, such as an electron beam, may be used instead of the laser light 50 to form the polycrystalline semiconductor thin film 5. As the characteristic feature of the invention, in the irradiation step, the cross sectional shape of the laser light 50 is changed and adjusted to the unit, and bulk irradiation of the unit at a time is conducted.

The crystallization method of the semiconductor thin film will be described in detail with reference to FIGS. 13A and 13B. As shown in FIG. 13A, the underlayer film 20 is formed on the substrate 0. The substrate 0 is not particularly limited, and a glass plate, for example, can be employed. The underlayer film 20 is not particularly limited, and an insulating material, such as silicon oxide, for example, can be employed. As the film forming step, the semiconductor thin film 4 comprising amorphous silicon is formed on the underlayer film 20 by a chemical vapor deposition (CVD) method. The amorphous semiconductor thin film 4 is formed to have a thickness, for example, of 40 nm. The amorphous semiconductor thin film 4 is formed, for example, by a low pressure (LP) plasma CVD method using monosilane ($SiH_4$), and it is preferred that the temperature conditions for accumulation is, for example, 500° C. or less. The conditions of film formation of amorphous silicon are, for example, a flow rate of the film forming gas $SiH_4$ of 140 sccm, an RF electric power for generating plasma of 100 W, a pressure of 53.3 Pa, and a film forming temperature of 420° C. Thereafter, the amorphous semiconductor thin film 4 is heated along with the substrate 0. The heating of the substrate is conducted, for example, by using a resistance wire, and the heating temperature of the substrate is set, for example, at 400° C.

As shown in FIG. 13B, the amorphous silicon is then irradiated with the excimer laser light 50 to conduct direct annealing of the amorphous silicon, and the molten region is recrystallized during the cooling process, so as to form a polycrystalline semiconductor thin film 5. As the excimer laser light 50, for example, xenon chloride (XeCl) excimer laser light having a wavelength of 308 nm is used. In this case, by using the irradiation apparatus having a total energy of excimer laser light 50, for example, of 10 J or more, the energy density is set, for example, at 300 mJ/$cm^2$, and the pulse width of the excimer laser light subjected to pulse oscillation is set, for example, at 150 ns. The excimer laser irradiation apparatus has an output power, for example, of 10 J, and a region, for example, of 60 mm×50 mm can be subjected to bulk irradiation at a time.

As described in the foregoing, according to the first aspect of the invention, the cross sectional shape of the laser light emitted from the laser irradiating apparatus is changed and adjusted to the prescribed region, and the region is irradiated at a time with the laser light, to realize uniform characteristics of the thin film transistors. By concentratedly utilizing the output of the laser light according to the manner, the uniformity of the device characteristics can be improved even by using a laser irradiation apparatus of a relatively low output power, and thus improvement in yield, high reliability and low cost can be realized. An inexpensive laser irradiation apparatus can be employed, and thus the initial cost can be suppressed. By changing and adjusting the cross sectional shape of the laser light corresponding to the region as the object of irradiation, diverse products of various kinds can be easily produced, and products of high quality can be supplied. In addition, by providing, in the laser irradiation apparatus, the mechanism of reading information of the substrate, it becomes possible to avoid operation mistakes, which brings about increase in yield. According to the second aspect of the invention, the cross sectional shape of the laser light is changed and adjusted to the unit (device size) of the thin film semiconductor device, and one or two or more units are irradiated at a time. According to the step, crystallization without non-uniformity at the boundary part of laser irradiation can be realized. When a large scale active matrix type display device of a 20-inch class is produced by using the polycrystalline silicon thus obtained as an active layer of a thin film transistor, mass production of an LCD panel having high uniformity and high performance can be realized.

Figure 14:
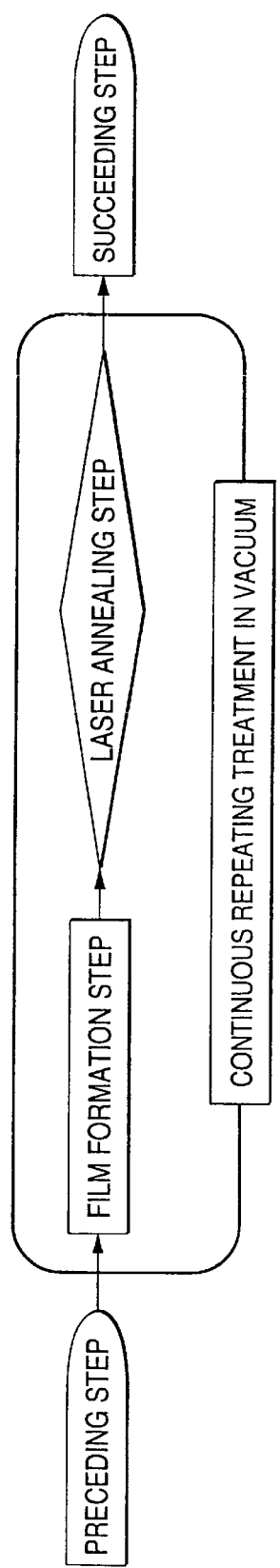
FIG. 14 is a schematic process diagram showing the process for producing a semiconductor thin film according to the invention.

Embodiments relating to the third aspect of the invention will be described in detail with reference to the drawings. FIG. 14 is a schematic process diagram showing the process for producing a semiconductor thin film according to the invention. The process for producing a semiconductor thin film is conducted as a part of a production process of a thin film semiconductor device, and it is conducted between a prescribed preceding step and a prescribed subsequent step. It basically comprises a film forming step of forming a semiconductor thin film comprising an amorphous material or a polycrystalline material having a relatively small particle diameter on a substrate, and a laser annealing step of irradiating a prescribed region of the semiconductor thin film with laser light having a prescribed cross sectional area to convert the amorphous material or the polycrystalline material having a relatively small particle diameter to a polycrystalline material having a relatively large particle diameter. It should be noted that in the process that the film forming step and the laser annealing step are alternately repeated to accumulate the semiconductor thin films without exposing the substrate to the air. By employing such a continuous repeating process in vacuum, a step of removing contamination substances and dusts from the air can be eliminated, and thus improvement in throughput is considerable. Furthermore, by alternately repeating the film forming step and the laser annealing step, crystals of high quality can be formed. It is preferred that irradiation of laser light is conducted at a condition in that TE/(d·S) is from 0.01 to 1, wherein d (nm) represents a thickness of the semiconductor thin film formed on a substrate having been formed on a substrate, TE (J) represents total energy of the laser light, and S ($cm^2$) represents an area of a region irradiated with the laser light at a time. In other words, a crystalline semiconductor thin film of high quality can be obtained by setting the energy density of laser light per unit area of the semiconductor thin film at a range of from 0.01 to 1. When the energy density is not more than 0.01, heating of the semiconductor thin film is insufficient, and when the energy density exceeds 1, the crystals disadvantageously becomes fine due to supply of excessive heat energy. In the case where the film forming step and the laser annealing step are alternately repeated, it is preferred to increase the energy of laser light with the lapse of the number of repetition. It is also preferred to decrease the thickness of the semiconductor thin film with the lapse of the repetition.

Figure 15:
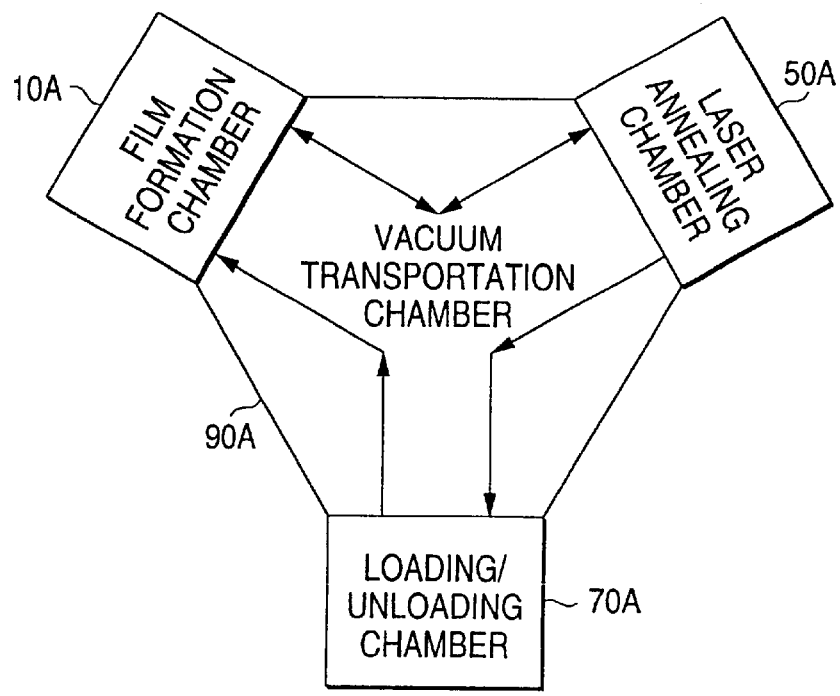
FIG. 15 is a block diagram showing the basic constitution of the apparatus for producing a semiconductor thin film according to the invention.

FIG. 15 is a block diagram showing the basic constitution of the apparatus for producing a semiconductor thin film according to the invention. As shown in the figure, the apparatus for producing a semiconductor thin film comprises a film forming chamber 10A, in which a semiconductor thin film comprising an amorphous material or a polycrystalline material having a relatively small particle diameter is formed on a substrate, and a laser annealing chamber 50A, in which a prescribed region of the semiconductor thin film is irradiated with laser light having a prescribed cross sectional area to convert the amorphous material or the polycrystalline material having a relatively small particle diameter to a polycrystalline material having a relatively large particle diameter. It should be noted that a vacuum transportation chamber 90A is provided between the film forming chamber 10A and the laser annealing chamber 50A, and the film forming step and the laser annealing step can be alternately repeated at a desired repeating number without exposing the substrate to the air. A loading/unloading chamber 70A is connected to the vacuum transportation chamber 90A.

Figure 16:
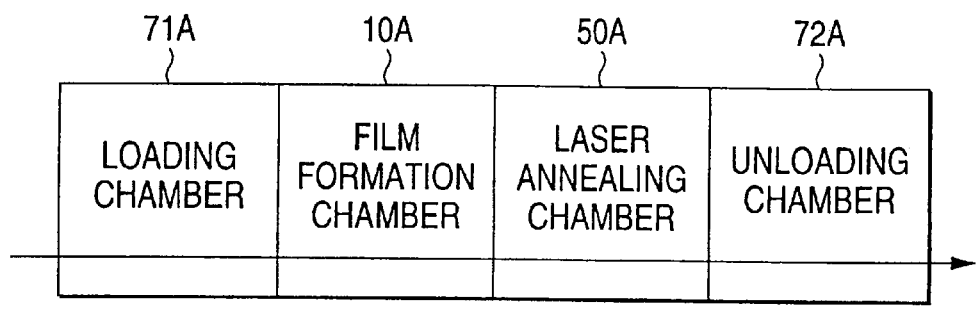
FIG. 16 is a schematic diagram showing another embodiment of the apparatus for producing a semiconductor thin film according to the invention.

FIG. 16 is a schematic diagram showing another embodiment of the apparatus for producing a semiconductor thin film according to the invention. In the embodiment shown in FIG. 15, the chambers are connected in a radial form through the vacuum transportation chamber as the center, whereas this embodiment has a constitution in that a film forming chamber 10A and a laser annealing chamber 50A are provided in series between a loading chamber 71A and an unloading chamber 72A. In order to alternately repeat the film forming step and the laser annealing step, the substrate can be moved back and forth between the film forming chamber 10A and the laser annealing chamber 50A.

The gist of the apparatus for producing a semiconductor thin film according to the invention resides in the combination of the film forming chamber 10A and the laser annealing chamber 50A. When a conventional laser device having poor throughput is used as the laser device installed in the laser annealing chamber 50A, it becomes the rate-determining step of the film forming step. Thus, a bulk laser device of high output is used instead of the conventional scanning type laser device of low output in the invention, thereby the throughput can be considerably improved. According to the invention, the processing time of the sum of the film forming step and the laser annealing step can be 5 minutes per 1 assembly. In this case, because the time required for film formation (about 2 minutes) and the time required for laser annealing (about 1.5 minutes) become the same level, the tact time can be 2 minutes per 1 assembly, and the effect of vacuum connection is considerably exhibited. In other words, the tack time is determined by the film forming step requiring the longer processing time. On the other hand, in the case where the conventional line beam scanning type laser device is installed, the processing time becomes 10 minutes per 1 assembly, and thus the required time is increased twice that in the production process according to the invention. In this case, because the time required for film formation (about 2 minutes) and the time required for laser annealing (about 6 minutes) are different from each other the tact time is determined by laser annealing to become 6 minutes per 1 assembly, and the effect of vacuum connection becomes extremely small. While the calculation is conducted herein with an overlap ratio of the linear laser light of 95%, it is necessarily 99% to obtain sufficient reliability. In this case, the tact time comes 15 minutes per 1 assembly, and thus the effect of vacuum connection is completely spoiled. Furthermore, in the case of the conventional process where no processing in vacuum is conducted, because the surface of the semiconductor thin film must be cleaned before the laser annealing step, the tact time becomes about 2 hours per 1 assembly, and thus it can be calculated that the invention improves the tact time by 20 times or more.

Figure 17:
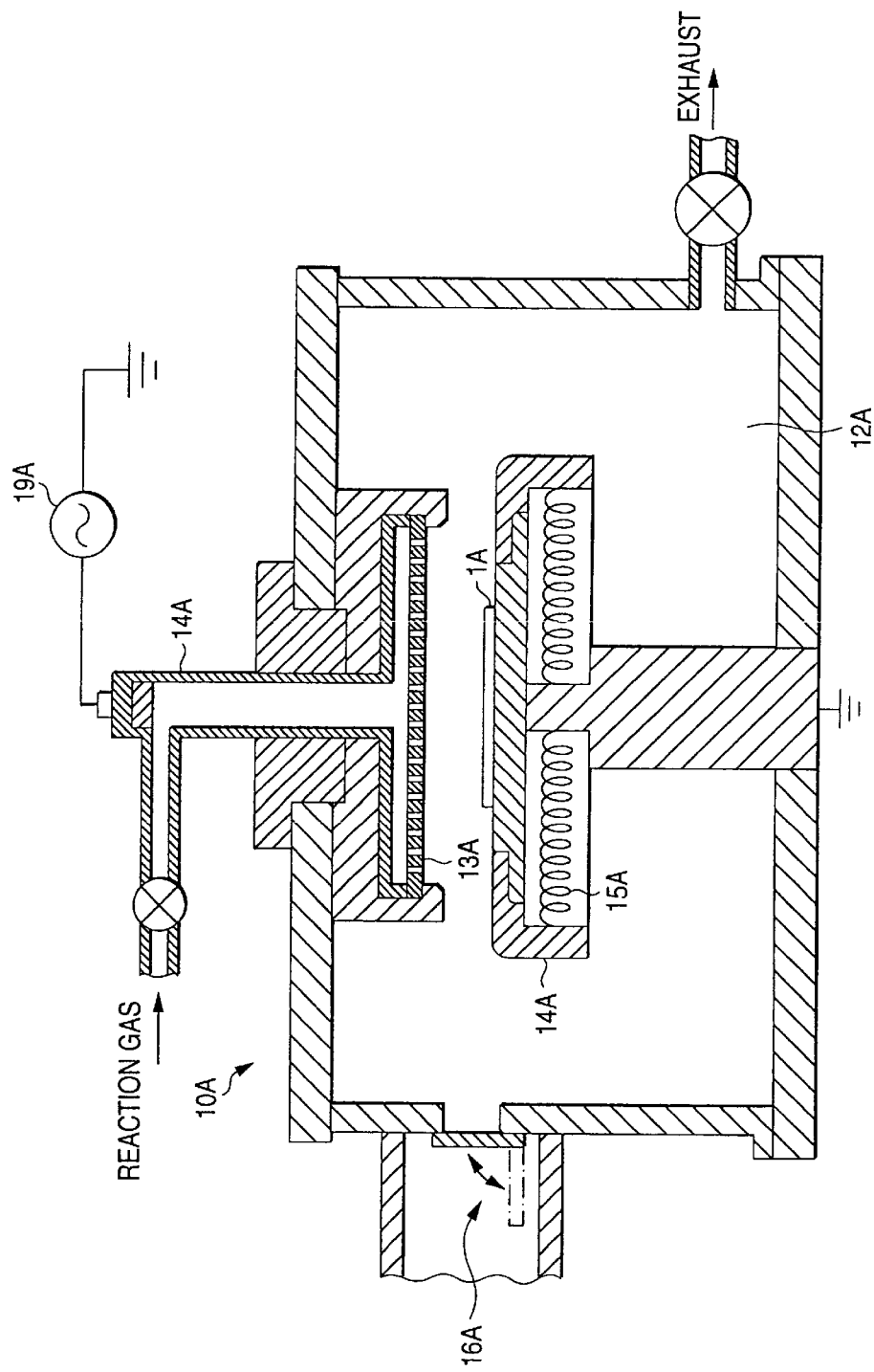
FIG. 17 is a schematic diagram showing one embodiment of the film forming chamber installed in the apparatus for producing a semiconductor thin film according to the invention.

FIG. 17 is a schematic diagram showing one embodiment of the film forming chamber 10A installed in the apparatus for producing a semiconductor thin film according to the invention. The film forming chamber 10A is a so-called plasma CVD apparatus and comprises a reaction chamber 12A that can be evacuated, and an electrode 13A for applying a high frequency wave and a stage 14A carrying an insulating substrate 1A as an object to be treated contained therein. However, the invention is not limited to this embodiment, and film forming chambers of other types may be employed. On an upper part of the electrode 13A having a nozzle form, an inlet tube 14A is connected, and a desired reaction gas is introduced through a valve. A high frequency wave power source 19A is connected to the inlet tube 14A, and applies a high frequency wave to the electrode 13A. The stage 14A is maintained at the ground potential, and a heater 15A for heating the insulating substrate 1A is contained inside the stage 14A. The insulating substrate 1A as the object to be treated is transported from a vacuum transportation chamber (not shown in the figure) into the reaction chamber 12A through a gate valve 16A. After completing the treatment, the insulating substrate 1A is withdrawn through the gate valve 16A, and then transported to a laser annealing chamber by the vacuum transportation chamber. Under the conditions in that the insulating substrate 1A is carried on the stage 14A installed in the reaction chamber 12A, and a desired reaction gas is introduced into the reaction chamber 12A through the electrode 13A having a nozzle form facing the insulating substrate 1A, when a high frequency wave is applied to the upper flat electrode 13A by the high frequency power source 19A, a plasma is generated to form a desired semiconductor thin film is formed on the insulating substrate 1A. At this time, the stage 14A is heated by the heater 15A to maintain the insulating substrate 1A to a prescribed temperature.

Figure 18:
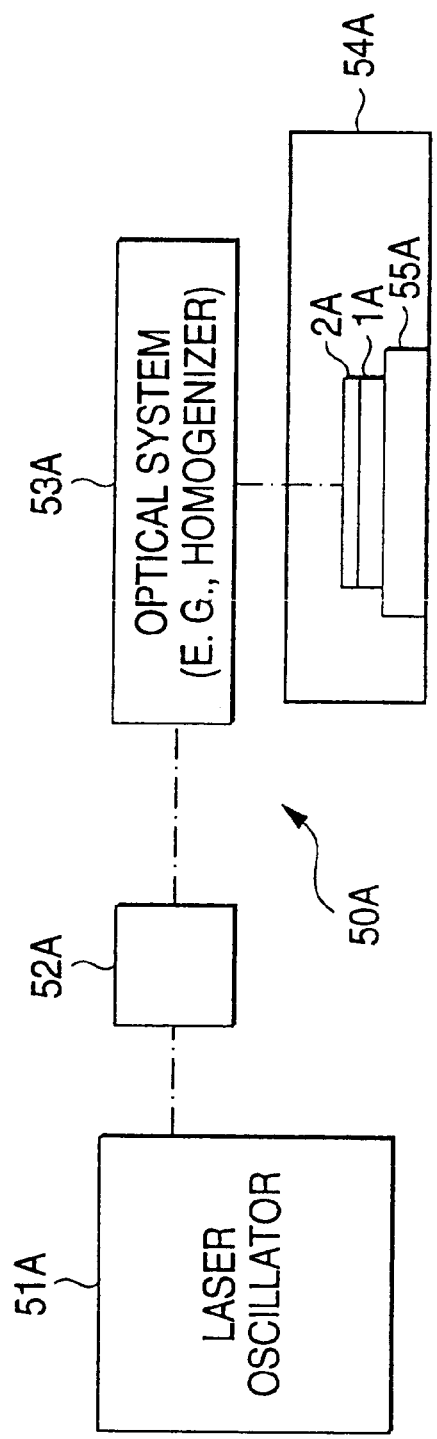
FIG. 18 is a schematic diagram showing a specific constitution of the laser annealing chamber installed in the apparatus for producing a semiconductor thin film according to the invention.

FIG. 18 is a schematic diagram showing a specific constitution of the laser annealing chamber 50A installed in the apparatus for producing a semiconductor thin film according to the invention. The laser annealing chamber 50A comprises a laser oscillator of high output 51A, an attenuator 52A, an optical system 53A containing a homogenizer, a treating chamber 54A, and a stage 55A. The laser oscillator 51A comprises an excimer laser light source and can intermittently emit laser light having a pulse width of 50 ns or more. The optical system 53A containing a homogenizer receives the laser light emitted from the laser oscillator 51A through the attenuator 52A, and shapes the cross sectional shape thereof to a rectangular shape having edges of 10 mm or more to be incident on a semiconductor thin film 2A. The insulating substrate 1A having the non-single crystal semiconductor thin film 2A previously formed is carried on the stage 55A inside the treating chamber 54A. The stage 55A can be moved in the X direction and the Y direction. In this embodiment, the stage 55A is driven, so that the laser light having a rectangular cross sectional shape is moved stepwise with respect to the semiconductor thin film 2A, and the surface of the semiconductor thin film 2A is irradiated with the laser light. The attenuator 52A is used for regulating the energy of the laser light emitted from the laser oscillator 51A. The optical system 53A shapes the cross sectional shape of the laser light to a rectangular shape, and adjust the laser light to have uniform energy distribution within the rectangular cross sectional shape. The interior of the treating chamber 54A is maintained to an inert atmosphere, such as vacuum or a nitrogen gas.

Figure 19A:
FIGS. 19A to 19F are a process diagram showing the process for producing a thin film transistor according to the invention.
Figure 19B:
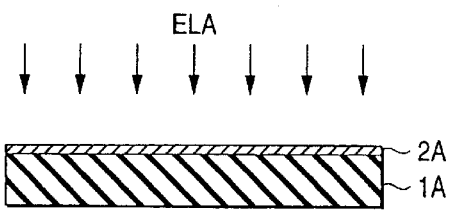
Figure 19C:
Figure 19D:
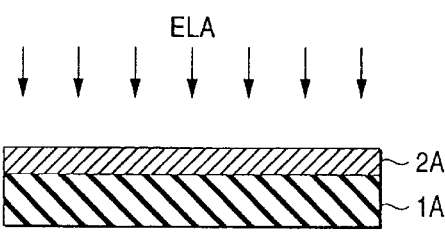
Figure 19E:
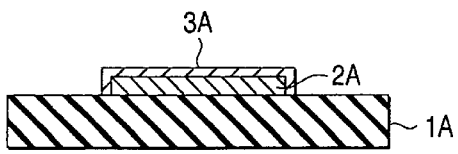
Figure 19F:
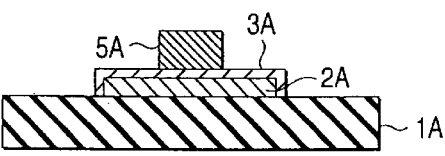

FIGS. 19A to 19F are a process diagram showing the process for producing a thin film transistor according to the invention. The thin film transistor has a laminated structure comprising a semiconductor thin film 2A, a gate insulating film 3A accumulated on one surface thereof, and a gate electrode 5A accumulated on the semiconductor thin film 2A through the gate insulating film 3A, and they are formed on an insulating substrate 1A. In the step shown in FIG. 19A, a semiconductor thin film 2A comprising an amorphous material or a semiconductor thin film 2A comprising a polycrystalline material having a relatively small crystalline particle diameter is accumulated on the insulating substrate 1A to a desired thickness. For example, a semiconductor thin film 2A comprising polycrystalline silicon having a thickness of 20 nm is formed by an LPCVD method. Thereafter, $Si^+$ ions accelerated by an electric field are implanted in the semiconductor thin film 2A, so that it is once made to be amorphous. Subsequently, in the step shown in FIG. 19B, the semiconductor thin film 2A is irradiated with excimer laser light, so that the semiconductor thin film 2A is crystallized, i.e., the so-called excimer laser annealing (ELA) is conducted. At this time, the insulating substrate 1A introduced into the film forming chamber in the step shown in FIG. 19A is transported to the laser annealing chamber of the step shown in FIG. 19B without exposing to the air as described in the foregoing. After completing the ELA, the insulating substrate 1A is again transported to the film forming chamber, and in the step shown in FIG. 19C, a non-crystallized semiconductor thin film 2A is formed on the crystallized semiconductor thin film in the same manner as in the step shown in FIG. 19A. Thereafter, in the step shown in FIG. 19D, the insulating substrate 1A is transported from the film forming chamber to the laser annealing chamber without breaking vacuum, and the ELA is conducted. According to the steps, the semiconductor thin film 2A accumulated as two layers are totally crystallized. The film forming step and the laser annealing step described above are alternately repeated to a desired number of times, and thus the semiconductor thin film 2A can be accumulated to have a necessary film thickness. Thereafter, in the step shown in FIG. 19E, the semiconductor thin film 2A is patterned corresponding to the shape of a device region. The semiconductor thin film 2A patterned in an island form is then covered with a gate insulating film 3A. Finally, in the step shown in FIG. 19F, a gate electrode 5A is formed on the gate insulating film 3A. An impurity is implanted into the semiconductor thin film 2A by using the gate electrode 5A as a mask in a self-alignment manner, and thus a thin film transistor of a top gate structure can be obtained. The invention can be applied to not only a thin film transistor of a top gate structure but also a thin film transistor of a bottom gate structure.

In the invention, a semiconductor thin film having excellent crystallinity can be obtained by alternately repeating the film forming step and the laser annealing step. For example, after forming a film of amorphous silicon having a thickness of 1 nm, a region of 30 cm×35 cm thereof is irradiated with laser light at an energy density of 15 mJ/cm$^2$ with a total energy of 15 J, and thus the semiconductor thin film having a thickness of 1 nm is crystallized. Thereafter, when the same film forming step and laser annealing step are repeated 40 times, a semiconductor thin film of excellent crystallinity having a thickness of 40 nm can be obtained. When a top gate type thin film transistor is produced by using the semiconductor thin film, the mobility of an N channel type reaches 400 cm$^2$/Vs.

Furthermore, after forming an amorphous silicon film having a thickness of 10 nm, when a rectangular region of 10 cm×15 cm thereof is irradiated with laser light at an energy density of 100 mJ/cm$^2$ by using a laser irradiating apparatus having an total energy of 15 J, the semiconductor thin film is crystallized. Thereafter, when the same film forming step and laser annealing step are alternately repeated 4 times, a semiconductor thin film of excellent crystallinity having a thickness of 40 nm is obtained. When a thin film transistor is produced by using the semiconductor thin film, the mobility of an N channel type reaches 350 cm$^2$/Vs. Processing time in this process is 8 minutes per 1 assembly, and it has been understood that the process can be sufficiently subjected to practical use.

As a result of experimentation conducted by the inventors, when a semiconductor thin film is crystallized under the conditions where the value of TE/(d·S) (i.e., the laser energy density per unit area) is from 0.01 to 1, wherein d (nm) represents a thickness of the semiconductor thin film having been formed, TE (J) represents total energy of the laser annealing step, and S (cm$^2$) represents an area of a region irradiated with the laser light at a time, the mobility of the resulting thin film transistor exceeds 200 cm$^2$/Vs. Furthermore, when the thickness of the semiconductor thin film formed in the first step is set at a relatively thin (for example, 5 nm) to control the generation probability of crystals is controlled, and the thickness in the second film formation is set at 35 nm, large crystals can be totally obtained, and the mobility of the resulting thin film transistor becomes 250 cm$^2$/Vs or more. In the process where the film forming step and the laser annealing step are alternately repeated, when the effective energy of the laser light incident on the film is increased with the lapse of the repetition of the film formation, the crystallinity is improved. In this case, the mobility of the resulting thin film transistor is 400 cm$^2$/Vs or more. Specifically, it is possible that the thickness of the semiconductor thin film is decreased, or the output energy of the laser light is increased with the lapse of the repetition of the treatment. In this case, furthermore, upon irradiation with laser light, irradiation may be conducted while the attenuator 52A in FIG. 18 and the optical system 53A in FIG. 18 are changed.

Figure 20:
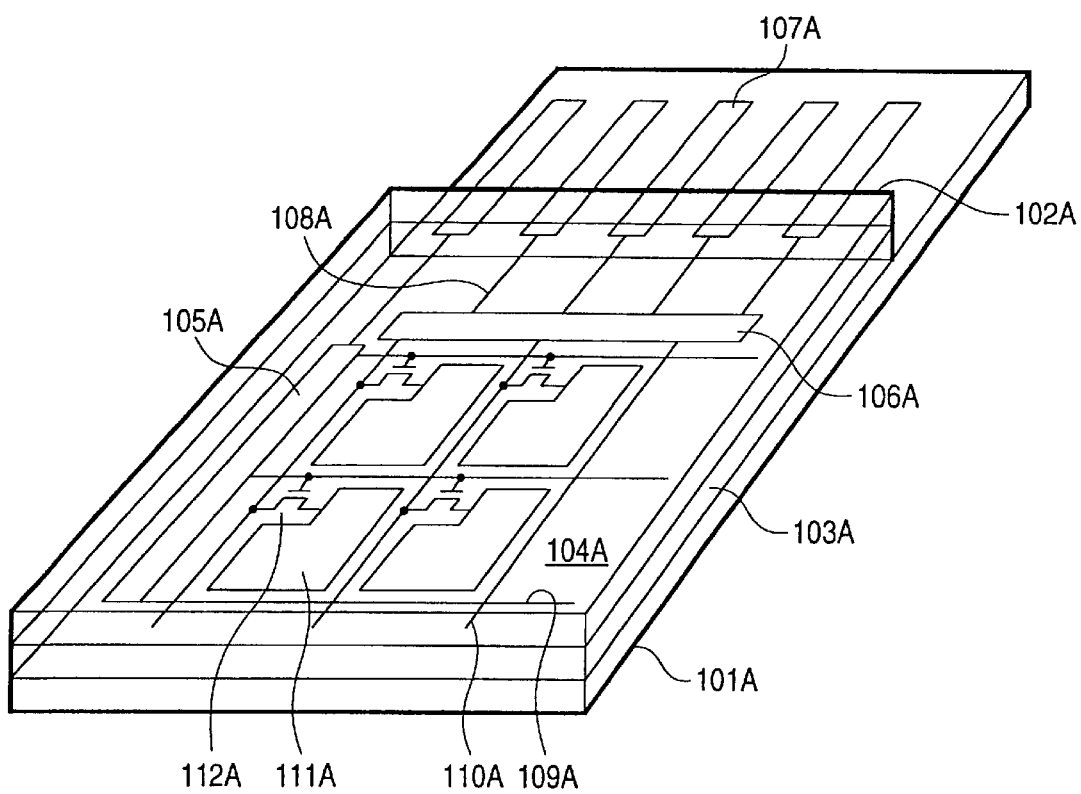
FIG. 20 is a schematic perspective view showing an example of an active matrix type display device using the thin film semiconductor device produced according to the invention.

An example of an active matrix type display device using the thin film transistor produced according to the invention as a driving substrate will be described with reference to FIG. 20. As shown in the figure, the display device has a panel structure comprising a pair of insulating substrates 101A and 102A, and an electrooptical substance 103A maintained between the substrates. As the electrooptical substance 103A, a liquid crystal material, for example, is used. The lower insulating substrate 101A has a pixel array part 104A and a driving circuit part integrated and formed thereon. The driving circuit part is divided into a vertical scanner 105A and a horizontal scanner 106A. A terminal part 107A for connecting to the outside is formed on the upper end of the periphery of the insulating substrate 101A. The terminal part 107A is connected to the vertical scanner 105A and the horizontal scanner 106A through wiring 108A. On the pixel array part 104A, gate wiring 109A having a line shape and signal wiring 110A having a column shape are formed. On the point of intersection of the gate wiring and the signal wiring, a pixel electrode 111A and a thin film transistor 112A driving the pixel electrode are formed. A gate electrode of the thin film transistor 112A is connected to the corresponding gate wiring 109A, a drain region thereof is connected to the corresponding pixel electrode 111A, and a source region thereof is connected to the corresponding signal wiring 110A. The gate wiring 109A is connected to the vertical scanner 105A, and the signal wiring 110A is connected to the horizontal scanner 106A. A thin film transistor 112A driving the pixel electrode 111A and thin film transistors contained in the vertical scanner 105A and the horizontal scanner 106A are produced according to the invention. Furthermore, a video driver and a timing generator, in addition to the vertical scanner and the horizontal scanner, may be integrated and formed within the insulating substrate 101A.

As described in the foregoing, according to the invention, the film formation step and the laser annealing step of bulk irradiation are continuously conducted in vacuum, and thus the throughput is improved. By alternately repeating the film forming step and the laser annealing step in vacuum, a semiconductor thin film of high quality can be produced with high throughput. When an active matrix type display device is produced by using a thin film transistor using the semiconductor thin film produced according to the invention as an active layer, a highly reliable panel with small amount of defects can be obtained with excellent yield.

Figure 21A:
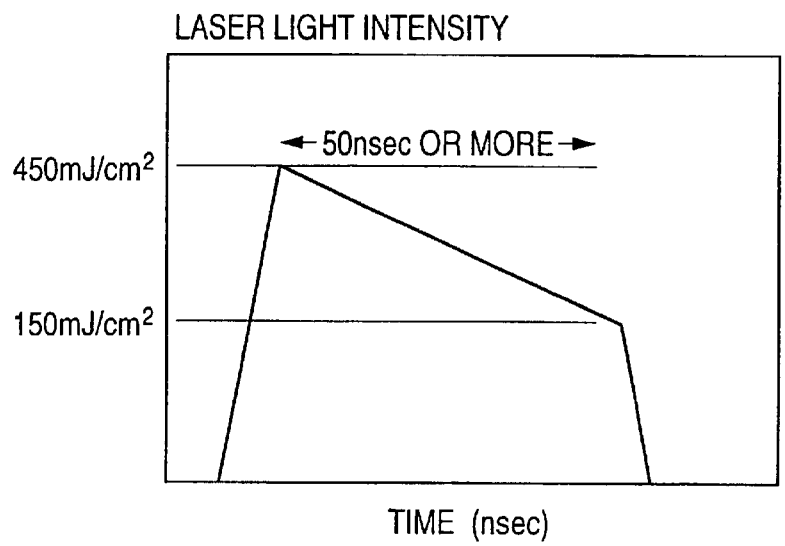
FIGS. 21A to 21C are schematic diagrams showing an embodiment of the fourth aspect of the invention.
Figure 21B:
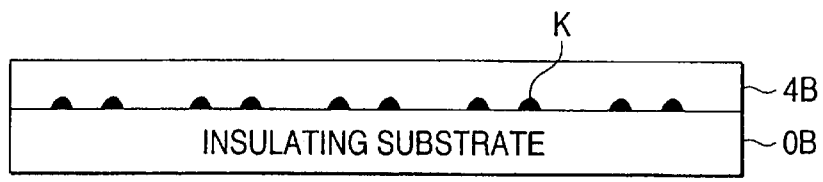
Figure 21C:
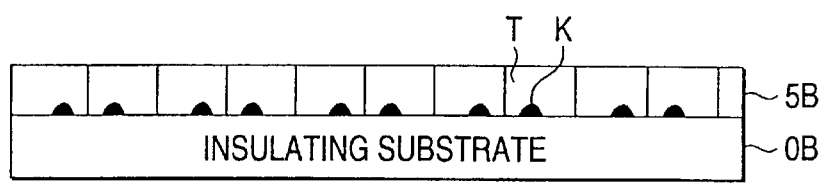

The fourth to seventh aspects of the invention will be described in detail. FIGS. 21A to 21C are schematic diagrams showing an embodiment of the fourth aspect of the invention. The process for producing a semiconductor thin film basically comprises a film forming step of forming a non-single crystal semiconductor thin film comprising an amorphous silicon or a polycrystalline silicon having a relatively small particle diameter on a surface of a substrate, and an annealing step of irradiating the non-single crystal semiconductor thin film with laser light to convert to a polycrystalline material. As shown in FIG. 21A, in the annealing step, the semiconductor thin film is irradiated once or more with a pulse of laser light having an emission time width from upstand to downfall of 50 ns or more and having a constant cross sectional area, and thus the semiconductor thin film contained in the irradiation region corresponding to the cross sectional area of the laser light is converted into a polycrystalline material at a time. At this time, the energy intensity of the laser light from upstand to downfall is controlled to apply a desired change. In this embodiment, as shown in FIG. 21A, an inclined change is applied, in which the energy intensity at downfall (for example, 150 mJ/cm$^2$) is smaller than the energy intensity at upstand (for example, 450 mJ/cm$^2$). In the annealing step, the semiconductor thin film can be irradiated with a pulse of laser light having a cross sectional area, for example, of 100 cm$^2$ or more.

FIG. 21B schematically shows the state of the semiconductor thin film after completing the upstand of the laser light pulse. A semiconductor thin film 4B comprising, for example, an amorphous silicon has been previously formed on an insulating substrate 0B comprising, for example, glass. The amorphous silicon semiconductor thin film 4B contains micro-nuclei K to be seeds of crystallization. At the time of completing the upstand of the laser light pulse, the semiconductor thin film 4B is substantially melted, but the nuclei K remain as they are. FIG. 21C schematically shows the state after the downfall of the laser light pulse. Since the insulating substrate 0B enters in a cooling step along with the completion of the downfall of the laser light pulse, the molten silicon is crystallized, and the amorphous semiconductor thin film 4B is converted to a polycrystalline semiconductor thin film 5B. At this time, crystal particles T contained in the polycrystalline semiconductor thin film 5B are those grown from the nuclei K as seeds. In this embodiment, the energy density at the start of irradiation of laser light is set at a higher value than that at the end of irradiation. According to such a procedure, the substrate temperature is firstly increased and then decreased. By providing such a decreasing inclination on the energy density, it is possible that the crystal growth can be gradually conducted from the nuclei K as centers with maintaining the orientation of the crystals. Because the cooling step, which is important for crystallization, can be gradually conducted, the crystallization is sufficiently conducted, and no non-crystalline region remains between the adjacent crystal particles.

Figure 22A:
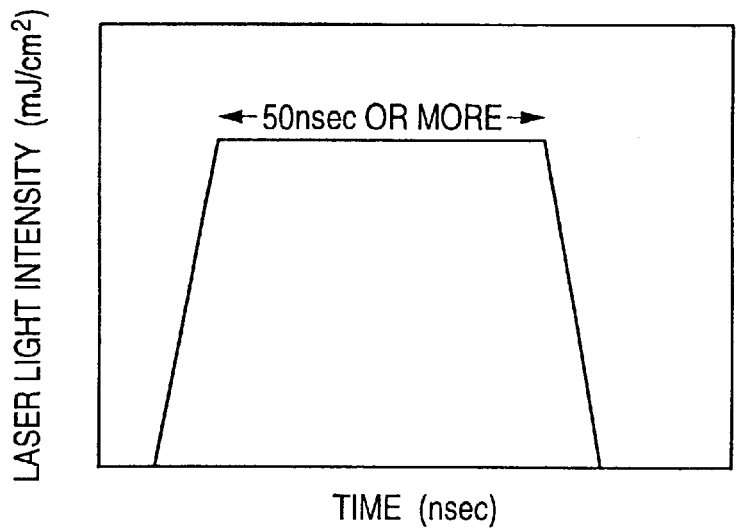
FIGS. 22A to 22C are schematic diagrams showing a reference example of the process for producing a semiconductor thin film.
Figure 22B:
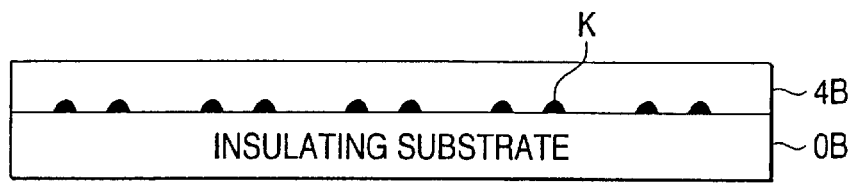
Figure 22C:
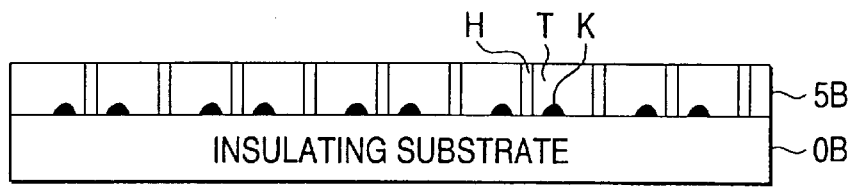

FIGS. 22A to 22C are schematic diagrams showing a reference example of the process for producing a semiconductor thin film, and FIG. 22A schematically shows the change in time of a laser light pulse used in an annealing step of the process. In this reference example, the laser light intensity is maintained at a constant value between upstand and downfall of the laser light pulse. In this case, as shown in FIG. 22B, the semiconductor thin film 4B comprising amorphous silicon is melted at the completion of the upstand of the laser light pulse, and contains nuclei K becoming seeds of crystal growth in a certain proportion. Thereafter, as shown in FIG. 22C, the semiconductor thin film suddenly enters a cooling step after completion of the downfall of the laser light pulse which maintains a constant density, and the amorphous semiconductor thin film 4B is converted to the polycrystalline semiconductor thin film 5B. However, because the cooling step is conducted suddenly, a non-crystalline region H that have not been crystallized remains between the crystal particles T contained in the polycrystalline semiconductor thin film 5B.

Figure 23A:
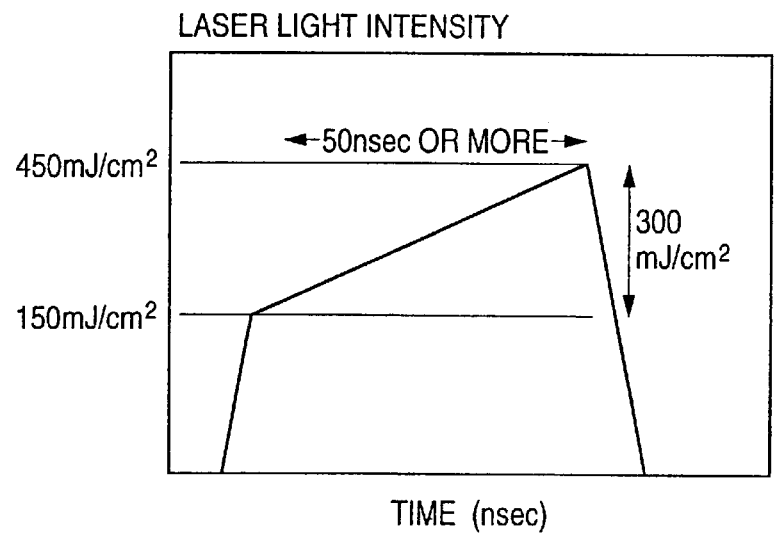
FIGS. 23A to 23C are schematic diagrams showing another embodiment of the fourth aspect of the invention.
Figure 23B:
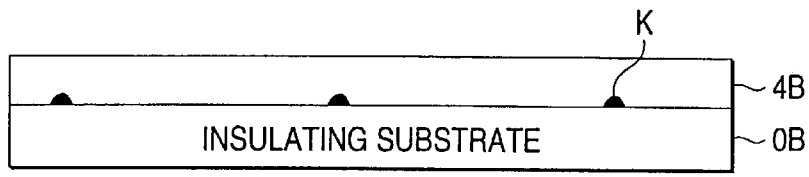
Figure 23C:
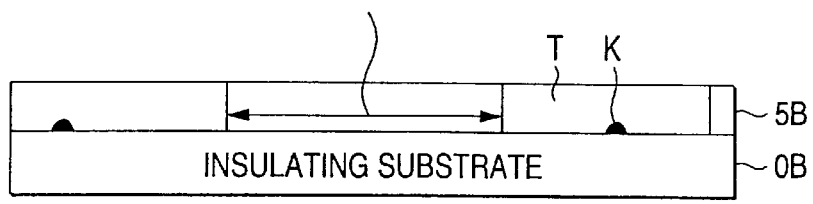

FIGS. 23A to 23C are schematic diagrams showing another embodiment of the process for producing a semiconductor thin film according to the fourth aspect of the invention, in which the same reference numbers are attached to the parts corresponding to the previous embodiment shown in FIGS. 21A to 21C for easiness of understanding. In this embodiment, the semiconductor thin film is irradiated with a laser light pulse having an increasing inclination, in which the energy intensity at downfall (for example, 450 mJ/cm$^2$) is larger than the energy intensity at upstand (for example, 150 mJ/cm$^2$). On applying the desired change by controlling the energy intensity of the laser light in this case, the change width thereof is 300 mJ/cm$^2$ or less. FIG. 23B schematically shows the state of the semiconductor thin film 4B immediately before the downfall of the laser light pulse. The amorphous semiconductor thin film 4B having been previously formed on the insulating substrate 0B is melted by irradiation of the laser light pulse. At this time, since the increasing inclination is applied to the energy intensity of the laser light pulse, the semiconductor thin film 4B is gradually heated, and due to the effect thereof, the remaining number of the nuclei K is decreased. Thereafter, as shown in FIG.

23C, because the semiconductor thin film enters the cooling step under the condition in that the remaining number of the nuclei K becomes small, the number of the crystal particles T contained in the polycrystalline semiconductor thin film 5B becomes small, and accordingly the size of the crystal particles T becomes as large as 50 nm or more. By gradually increasing the intensity of the laser light, the number of crystal nuclei generated in the substrate is decreased. Because the crystal growth is determined by the number of the crystal nuclei, larger crystals can be obtained when the distance among the crystal nuclei is large. In general, the difference between the intensity of the laser light at upstand and the intensity of the laser light at downfall of the laser light pulse is necessarily 300 mJ/cm$^2$ or less. The reason of this is that an energy intensity of at least 150 mJ/cm$^2$ is required for the solid phase transition of silicon, i.e., for generating transition from the liquid phase by cutting the bond between silicon atoms, and when the energy density is increased to exceed 450 mJ/cm$^2$, the crystal growth is inhibited to produce a microcrystalline state. The laser light pulse used in this embodiment is of high output to have a light emission time width (duration time) of more than 50 ns, and preferably a laser light pulse having a duration time of 100 ns or more is employed. In some cases, the crystallization may be conducted by irradiating twice or more on the same part.

Figure 24:
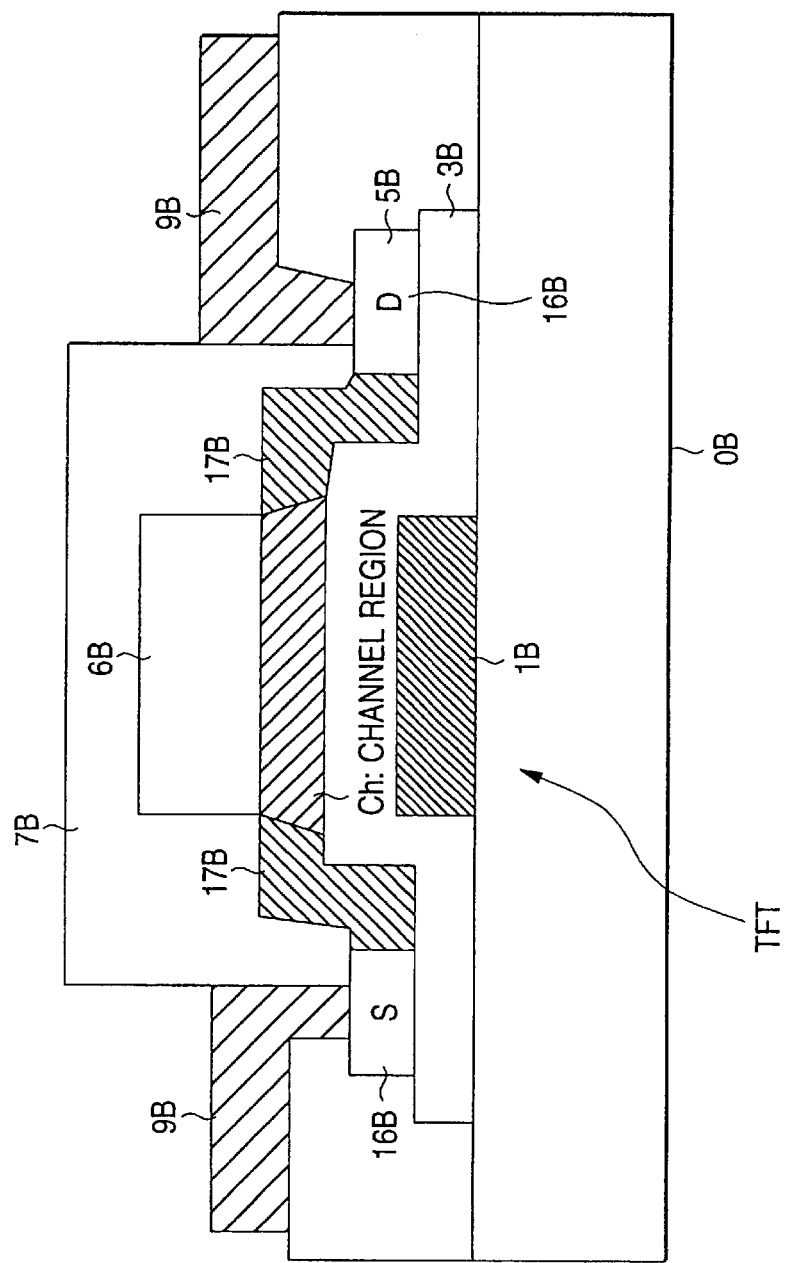
FIG. 24 shows a specific constitution of a thin film transistor using a semiconductor thin film produced according to the invention as an active layer.

FIG. 24 shows a specific constitution of a thin film transistor using a semiconductor thin film produced according to the invention as an active layer. The thin film transistor TFT has a bottom gate structure and comprises a gate electrode 1B formed by patterning on an insulating substrate 0B, a gate insulating film 3B covering the gate electrode, and a semiconductor thin film 5B formed thereon. The semiconductor thin film 5B comprises polycrystalline silicon that is crystallized according to the invention. In the semiconductor thin film 5B, a channel region Ch and a high concentration impurity region 16B to be a drain D and a source S are formed. In this embodiment, the thin film transistor TFT is of an n channel type, and the high concentration impurity region 16B is of an N$^+$ type. The channel region Ch is covered with a protective film 6B that also functions as a mask on ion doping. Furthermore, the whole of the thin film transistor TFT is covered with an interlevel insulating film 7B. On the interlevel insulating film 7B, metallic wiring 9B is formed by patterning, which is electrically connected to the drain D and the source S through contact holes. A low concentration impurity region 17B is provided in the thin film transistor TFT between the high concentration impurity region 16B of the drain D side and the channel region Ch. A low concentration impurity region 17B is also provided between the high concentration impurity region 16B of the source S side and the channel region Ch. The low concentration impurity region 17B is provided to relax the electric field concentration at the drain edge and to suppress the leakage electric current.

Figure 25:
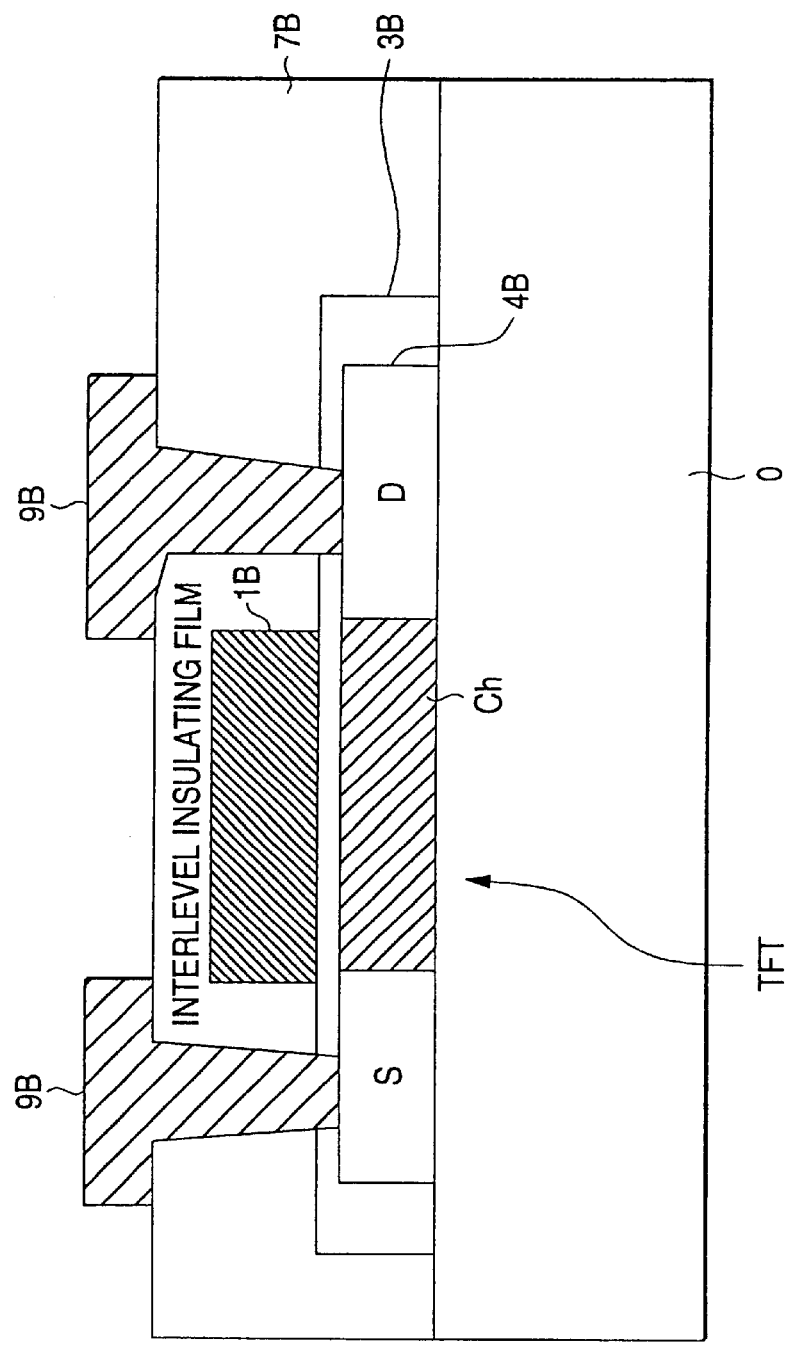
FIG. 25 shows another embodiment of a thin film transistor using a semiconductor thin film produced according to the invention as an active layer.

FIG. 25 shows another embodiment of a thin film transistor using a semiconductor thin film produced according to the fourth aspect of the invention as an active layer. The same reference numbers are attached to the parts corresponding to the embodiment shown in FIG. 24 for easiness of understanding. The thin film transistor TFT of this embodiment has a top gate structure. A semiconductor thin film 5B comprising, for example, polycrystalline silicon that is crystallized according to the invention is formed on a transparent insulating substrate 0B comprising, for example, glass. The thin film transistor TFT is integrated and formed by using the semiconductor thin film 5B as an active layer. The thin film transistor TFT comprises a gate electrode 1B formed by patterning on the semiconductor thin film 5B through a gate insulating film 3B. In a part of the semiconductor thin film 5B positioned on both sides of the gate electrode 1B, an n type impurity is implanted at a high concentration to form a source region S and a drain region D of the thin film transistor TFT. According to the configuration, an N channel type thin film transistor is obtained. In the case of producing a P channel type thin film transistor, a p type impurity is implanted in the semiconductor thin film 5B. The thin film transistor TFT having such a constitution is covered with an interlevel insulating film 7B comprising, for example, PSG. On the interlevel insulating film 7B, metallic wiring 9B is formed by patterning. The metallic wiring 9B is obtained by forming a film of aluminum by sputtering, and then patterning to a desired shape. An aluminum-silicon alloy containing about 1% of silicon may be employed instead of aluminum. Alternatively, a metallic material, such as molybdenum, titanium, gold, silver, palladium, tantalum, tungsten, nickel and chromium, may also be employed instead of aluminum. Furthermore, a silicide, which is a compound of silicon and these metallic elements, may be employed instead of a pure metal. Contact holes are previously formed in the interlevel insulating film 7B, through which the metallic wiring 9B is electrically connected to the source region S and the drain region D of the thin film transistor TFT.

Figure 26:
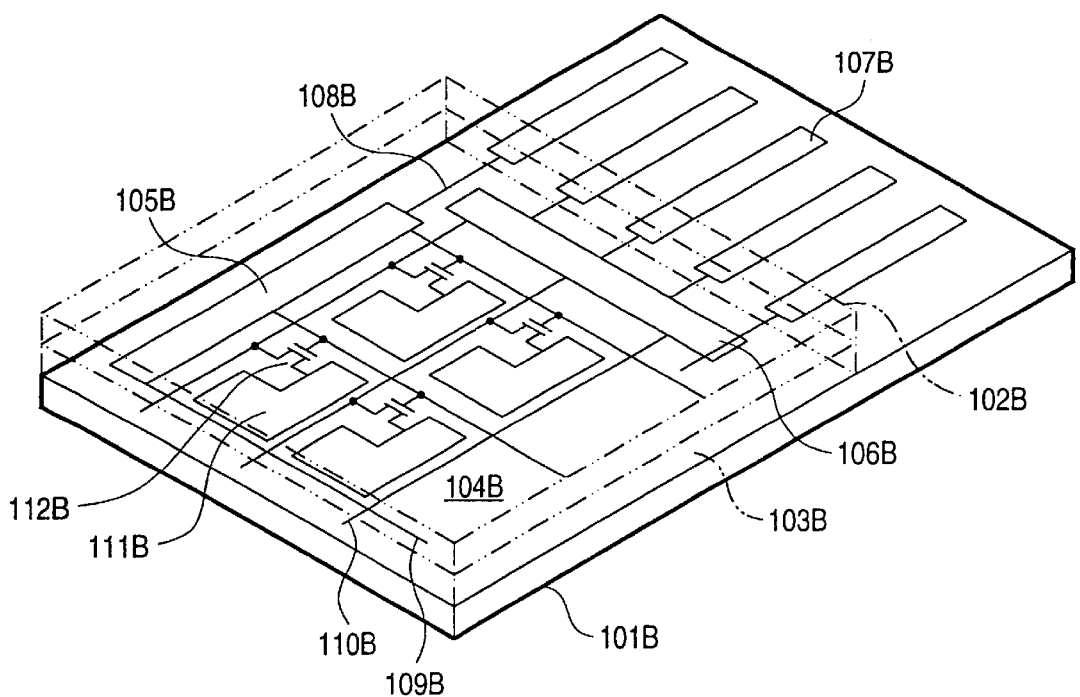
FIG. 26 is a schematic perspective view showing an embodiment of an active matrix display device produced by using a thin film transistor shown in FIG. 24 or FIG. 25.

FIG. 26 is a schematic perspective view showing an embodiment of an active matrix type display device produced by using a thin film transistor shown in FIG. 24 or FIG. 25. As shown in the figure, the display device has a flat panel structure comprising a pair of insulating substrate 101B and transparent substrate 102B, and an electrooptical substance 103B maintained between the substrates. As the electrooptical substance 103B, a liquid crystal material, for example, is used. The lower insulating substrate 101B has a pixel array part 104B and a driving circuit part integrated and formed thereon. The driving circuit part is divided into a vertical driving circuit 105B and a horizontal driving circuit 106B. A terminal part 107B for connecting to the outside is formed on the upper end of the periphery of the insulating substrate 101B. The terminal part 107B is connected to the vertical driving circuit 105B and the horizontal driving circuit 106B through wiring 108B. On the pixel array part 104B, gate wiring 109B having a line shape and signal wiring 110B having a column shape are formed. On the point of intersection of the gate wiring and the signal wiring, a pixel electrode 111B and a thin film transistor 112B driving the pixel electrode are formed. A gate electrode of the thin film transistor 112B is connected to the corresponding gate wiring 109B, a drain region thereof is connected to the corresponding pixel electrode 111B, and a source region thereof is connected to the corresponding signal wiring 110B. The gate wiring 109B is connected to the vertical driving circuit 105B, and the signal wiring 110B is connected to the horizontal driving circuit 106B. The vertical driving circuit 105B and the horizontal driving circuit 106B are constituted with thin film transistors. These thin film transistors are produced according to the invention. The semiconductor thin film to be the active layer thereof is one obtained in such a manner that after forming a non-single crystal silicon film on the substrate 101B, the non-single crystal silicon film is irradiated once or more with a pulse of laser light having an emission time width from upstand to downfall of 50 ns or more and having a constant cross sectional area, so that the non-single crystal silicon contained in the irradiated area corresponding to the cross sectional area of the laser light is converted to polycrystalline silicon at a time, and the polycrystalline silicon is modified by applying a desired change to the energy intensity of the laser light from upstand to downfall of the pulse.

Figure 27:
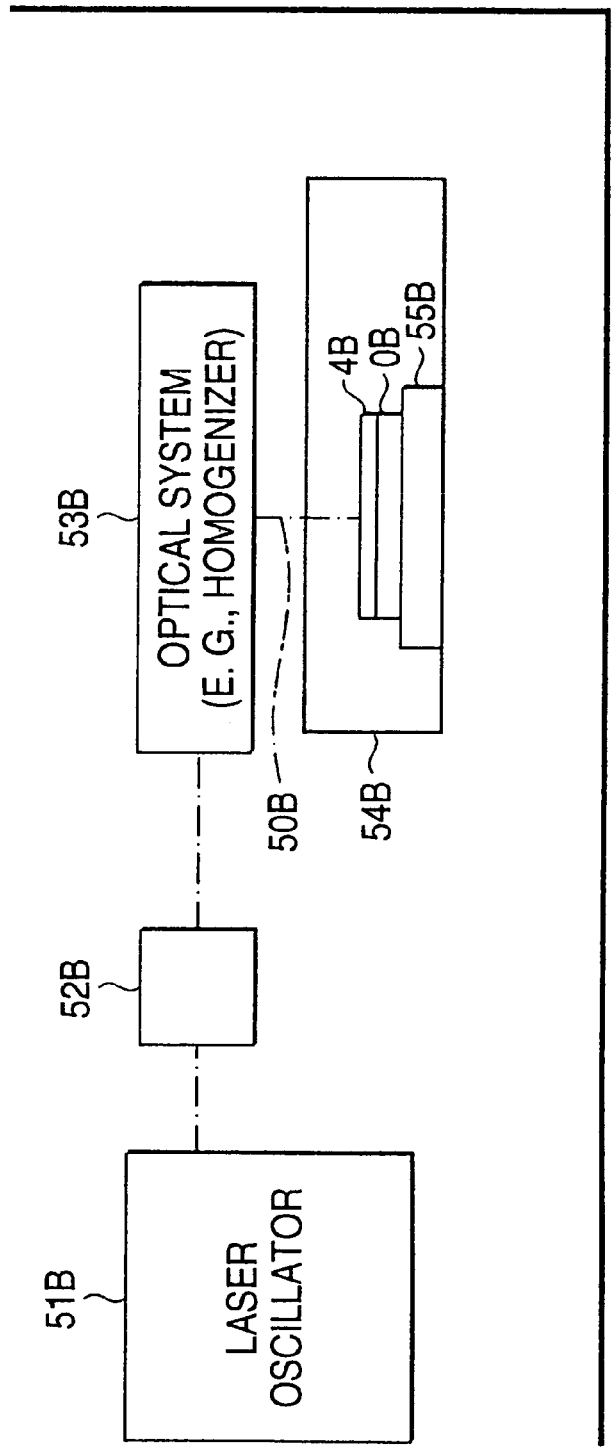
FIG. 27 is a schematic block diagram showing a laser irradiating apparatus used in the process for producing a semiconductor thin film according to the fourth aspect of the invention.

FIG. 27 is a schematic block diagram showing a laser irradiating apparatus used in the process for producing a semiconductor thin film according to the fourth aspect of the invention shown in FIGS. 21A to 21C. The laser irradiation apparatus is to irradiate a semiconductor thin film 4B comprising an amorphous material or a polycrystalline material having a relatively small particle diameter formed on an insulating substrate 0B with laser light 50B to convert to a polycrystalline material having a relatively large particle diameter, and comprises a laser oscillator 51B (laser light source) emitting a pulse of laser light having an emission time width from upstand to downfall of 50 ns or more; an optical system 53B (shaping means), such as a homogenizer for shaping the cross sectional shape of the laser light 50B to a constant shape; irradiating means (a chamber 54B and a stage 55B) for irradiating the semiconductor thin film 4B once or more with a pulse of laser light 50B thus shaped, so as to convert the semiconductor thin film 4B contained in the irradiated region corresponding to the cross sectional area of the laser light 50B to a polycrystalline material at a time; and controlling means for controlling the energy intensity of the laser light from upstand to downfall to apply a desired change. The controlling means applies a desired change to the energy intensity of the laser light 50B, for example, by controlling the RC time constants of an oscillation circuit constituting the laser oscillator 51B. In this case, the profile of the laser light 50B may be changed in space by the optical system 53B.

Figure 28:
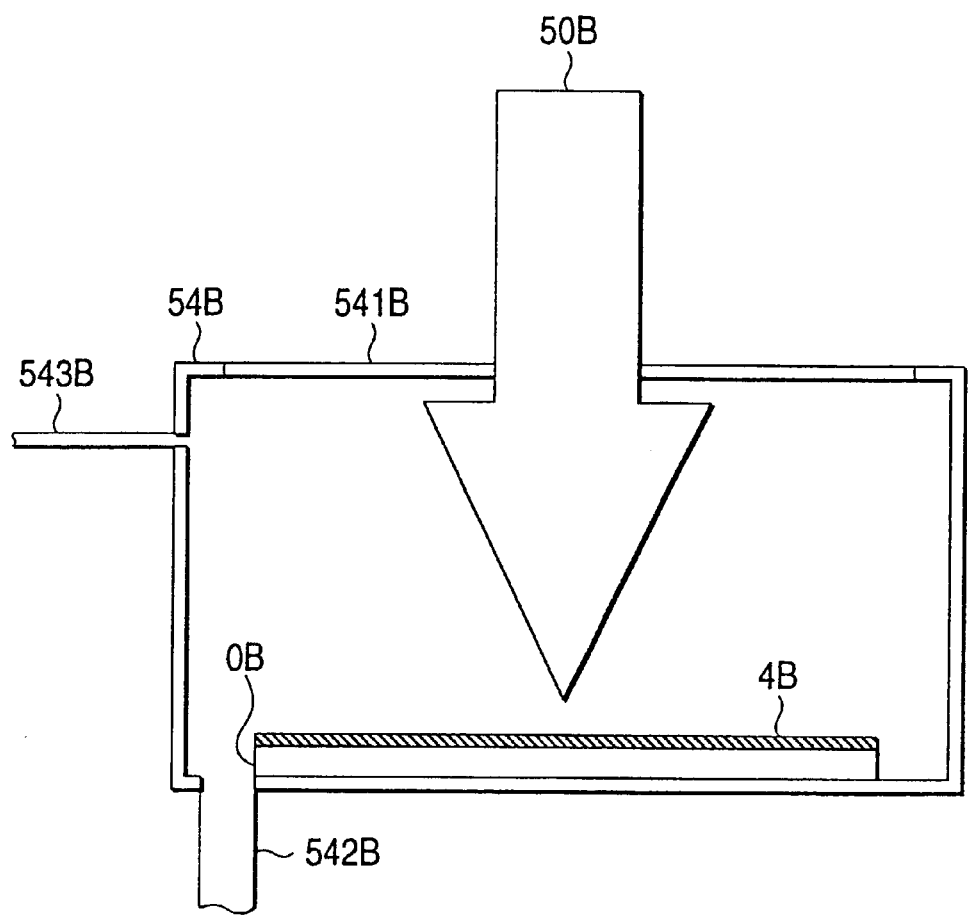
FIG. 28 is a schematic diagram showing an important part of the process for producing a semiconductor thin film according to the fifth aspect of the invention.

FIG. 28 is a schematic diagram showing an important part of the process for producing a semiconductor thin film according to the fifth aspect of the invention. The process for producing a semiconductor thin film basically comprises a film forming step of forming a non-single crystal semiconductor thin film 4B on a surface of an insulating substrate 0B; and an annealing step of irradiating the non-single crystal semiconductor thin film 4B with laser light 50B to convert to a polycrystalline material. FIG. 28 schematically shows the constitution of the chamber of the laser irradiation apparatus used in the annealing step. In the annealing step, by using the chamber 54B, the substrate 0B is irradiated once or more with a pulse of laser light 50B having an emission time width of 50 ns or more and having a constant cross sectional area under the condition in that the substrate 0B is maintained in a non-oxidative atmosphere, so as to convert the semiconductor thin film 4B contained in the irradiated region corresponding to the cross sectional area of the laser light 50B to a polycrystalline material at a time. The chamber 54B used in the annealing step can contain the semiconductor thin film 4B having been previously formed the insulating substrate 0B, and comprises at a top part thereof, a quartz window 541B, through which the excimer laser light 50B is incident. The chamber 54B also comprises on a side wall thereof, an inlet 543B of an inert gas, and on a bottom wall thereof, an exhaust 542B connected to a vacuum pump (not shown in the figure). By conducting the annealing step using the chamber 54B having such a constitution, the substrate 0B can be irradiated with the laser light 50B under the condition in that the substrate 0B is maintained in a non-oxidative atmosphere comprising vacuum. Alternatively, the substrate 0B can be irradiated with the laser light 50B under the condition in that the substrate 0B is maintained in a non-oxidative atmosphere filled with an inert gas, such as He, $N_2$ and Ar. In this case, the substrate 0B can be irradiated with the laser light 50B under the condition in that the substrate 0B is maintained in a non-oxidative atmosphere filled with an inert gas at an atmospheric pressure or with a pressurized inert gas. In any case, bonding of oxygen contained in the air and silicon is prevented to suppress the generation of crystal defect centers by irradiating with laser light 50B in a non-oxidative atmosphere. In the annealing step, the insulating substrate 0B is irradiated with a pulse of the laser light 50B having a cross sectional area of 5 $cm^2$ or more. The insulating substrate 0B is irradiated with the laser light 50B, the energy intensity of which is controlled to the range of from 400 to 600 $mJ/cm^2$.

A laser irradiation apparatus used in the process for producing a semiconductor thin film according to the fifth aspect of the invention comprises the chamber 54B shown in FIG. 28, and its total constitution is shown in FIG. 27. That is, the laser irradiating apparatus according to the fifth aspect comprises a laser oscillator 51B emitting a pulse of laser light having an emission time width of 50 ns or more; an optical system 53B, such as a homogenizer for shaping the cross sectional area of the laser light 50B; a chamber 54B maintaining the substrate 0B having the semiconductor thin film 4B previously formed in a non-oxidative atmosphere; an optical system for irradiating the substrate 0B maintained in a non-oxidative atmosphere once or more with a pulse of the laser light 50B thus shaped, so as to convert the semiconductor thin film 4B contained in the irradiated region corresponding to the cross sectional area of the laser light 50B to a polycrystalline material at a time.

Figure 29:
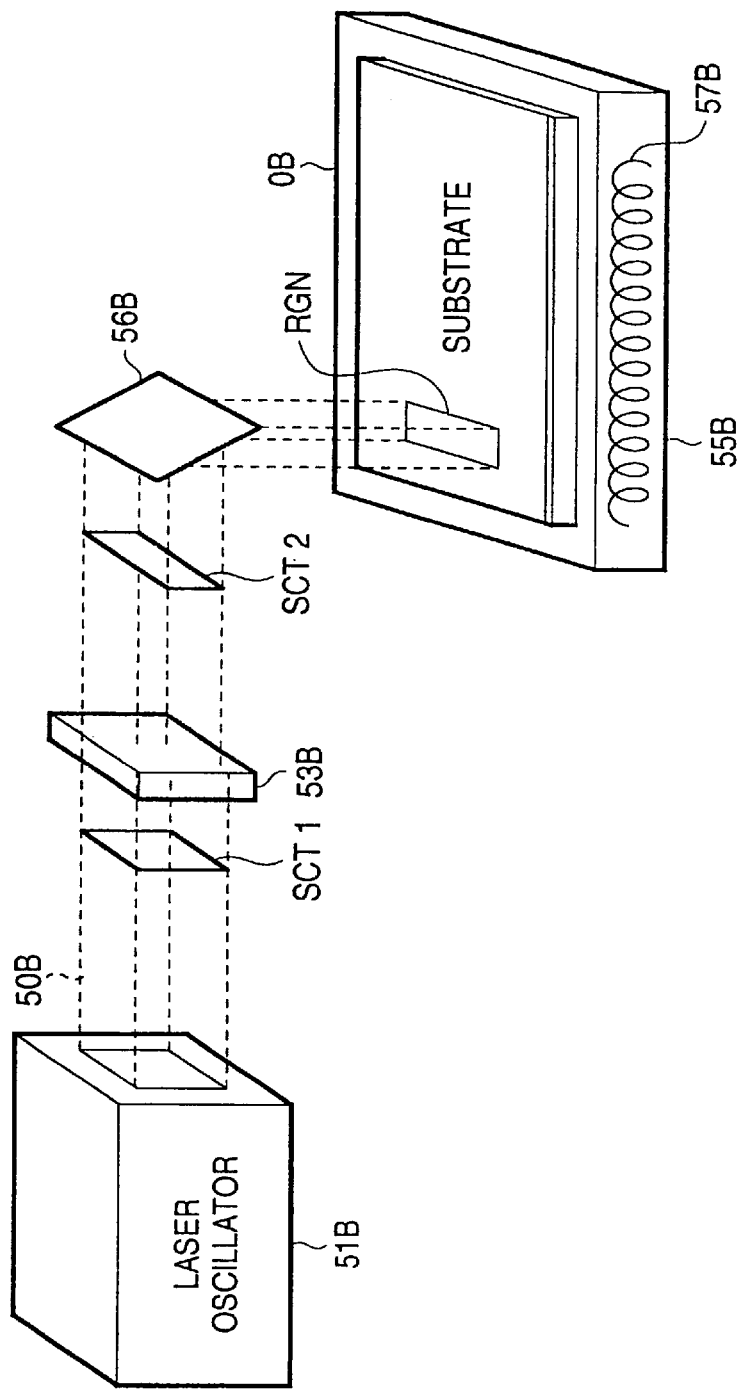
FIG. 29 is a schematic block diagram showing a laser irradiation apparatus used in the process for producing a semiconductor thin film according to the sixth aspect of the invention.

FIG. 29 is a schematic block diagram showing a laser irradiation apparatus used in the process for producing a semiconductor thin film according to the sixth aspect of the invention. As shown in the figure, the laser irradiation apparatus comprises a laser oscillator 51B, from which laser light 50B having a prescribed cross sectional shape SCT1 is irradiated in a pulse form. While the laser light 50B passes through a homogenizer part 53B, the cross sectional area thereof is shaped to SCT2, and the uniformity in the cross sectional area is improved. Thereafter, the laser light 50B is reflected by a reflector 56B to be incident on the substrate 0B carried on an XY stage 55B. On the surface of the substrate 0B, a semiconductor thin film comprising an amorphous silicon or a polycrystalline silicon having a small particle diameter is previously formed. The XY stage 55B moves stepwise on the substrate 0B at a suitable overlap amount in such a manner that uniform crystallinity can be obtained in the respective shots of the laser light 50B. At this time, the dispersion of energy values of the shots of pluses of the laser light 50B is determined by the accuracy of the laser oscillator 51B. Dispersion of from 5 to 10% is practically formed among the pulses, which brings about dispersion in operation characteristics of thin film transistors when no measures is employed. In the invention, accordingly, a substrate heating mechanism comprising a heater 57B is provided inside the stage 55B, whereby uniform heating is conducted to the condition in that the temperature distribution of the whole surface of the substrate 0B is controlled to 20° C. or less. The heater 57B may comprise a single system or plural systems. The systems can be independently subjected to temperature control, and thus the mechanism can control the temperature distribution of the whole surface of the substrate 0B to the minimum. As the heating means, a mechanism of heating by magnetic loss and an external radiation heat mechanism, such as a lamp may be employed instead of the heater 57B. Furthermore, it is not necessary that the heating means of the substrate 0B is embedded in the movable stage 55B, but in the case where the optical system is a movable laser irradiation apparatus, the substrate heating mechanism may be embedded in a fixed stage.

By using the laser irradiation apparatus shown in FIG. 29, the process for producing a semiconductor thin film according to the sixth aspect of the invention can be practiced. That is, the process for producing a semiconductor thin film basically comprises a film forming step of forming a non-single crystal semiconductor thin film on a surface of a substrate 0B; and an annealing step of irradiating the non-single crystal semiconductor thin film with laser light 50B to covert to a polycrystalline material. In the annealing step, the substrate 0B is irradiated once or more with a pulse of the laser light 50B having an emission time width of 50 ns or more and having a constant cross sectional area SCT2, so as to convert the semiconductor thin film contained in the irradiated region RGN corresponding to the cross sectional area SCT2 of the laser light 50B to a polycrystalline material at a time. In this case, it is preferred that irradiation of the laser light 50B is conducted under the condition in that the substrate 0B is heated and maintained in a vacuum atmosphere. Alternatively, irradiation of the laser light 50B may be conducted under the condition in that the substrate 0B is heated and maintained in an inert gas atmosphere. Furthermore, in the case where the substrate 0B comprises, for example, glass, the substrate 0B is preferably uniformly heated to a temperature of from 300 to 450° C. by using the heater 57B. When the heating is less than 300° C., the effect of heating is not considerable, and when it exceeds 450° C., sudden contraction deformation of the substrate 0B occurs.

Figure 30:
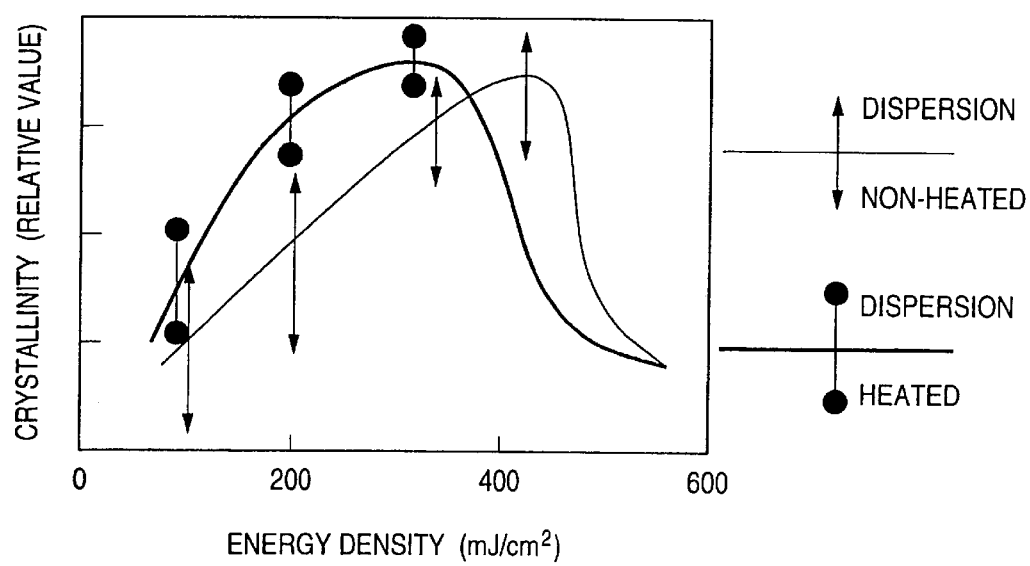
FIG. 30 is a graph showing the result of investigation of dispersion in crystallinity depending on heating of the substrate.

FIG. 30 is a graph showing the result of investigation of dispersion in crystallinity depending on heating of the substrate. The abscissa of the graph shows the energy density of laser light, and the ordinate shows relative values of crystallinity. The crystallinity is a numerical value obtained from the result of optical measurement of the surface of the semiconductor thin film, which quantitatively indicates the extent of crystallinity. In the case where no heating is conducted, the dispersion width of crystallinity is large, but the dispersion width is improved by ½ or less when heating is conducted. In the crystallization process in laser annealing, as a factor determining the crystallinity, when the cooling step of silicon melted by laser annealing to recrystallization gradually proceeds, it has been known that crystal particles having a large diameter are obtained. In this embodiment, the cooling time is prolonged by applying the substrate heating mechanism, and as a result, the crystallinity is improved. Furthermore, in the case where heating is conducted, the energy density of the laser light providing the maximum crystallinity is shifted to the lower side by about 100 mJ/cm$^2$ in comparison to the case where heating is not conducted, and thus good crystallinity can be obtained with a lower laser energy. It means that assuming that the energy of the laser oscillator is constant, a larger area of the region that can be subjected to bulk irradiation at a time by conducting heating of the substrate can be obtained, and as a result, a laser irradiation apparatus exhibiting high productivity by decreasing the tact time can be provided. Furthermore, when the substrate heating mechanism of the laser irradiation apparatus is contained in the vacuum chamber, oxidation of silicon and contamination due to micro-particles in the air during heating can be prevented. Alternatively, when the substrate heating mechanism of the laser irradiation apparatus is contained in an inert gas atmosphere, oxidation of silicon and contamination due to micro-particles in the air during heating can be prevented, and the productivity is also improved.

Figure 31A:
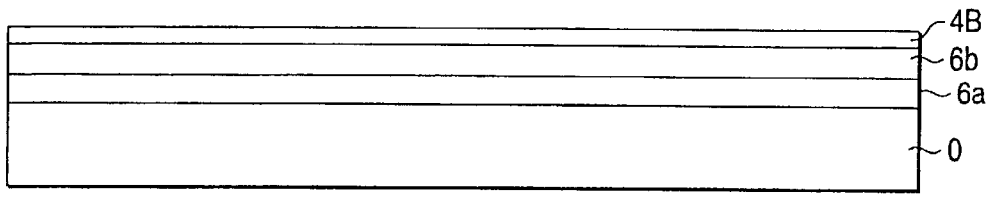
FIGS. 31A to 31C are process diagrams showing a process for producing a thin film transistor using the semiconductor thin film produced by the process for producing a semiconductor thin film according to the sixth aspect of the invention as an active layer.
Figure 31B:
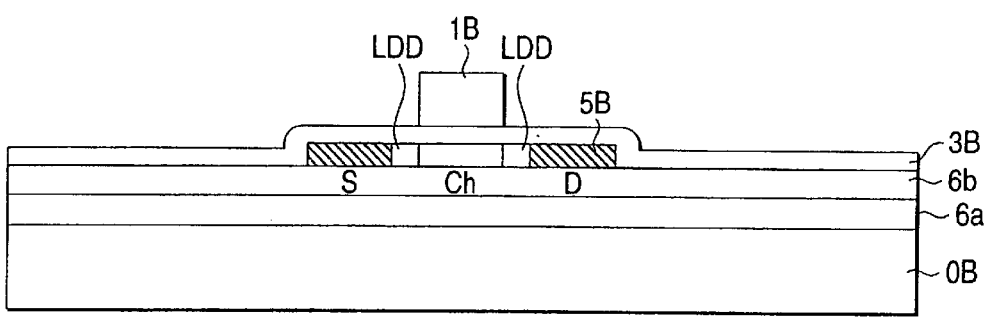
Figure 31C:
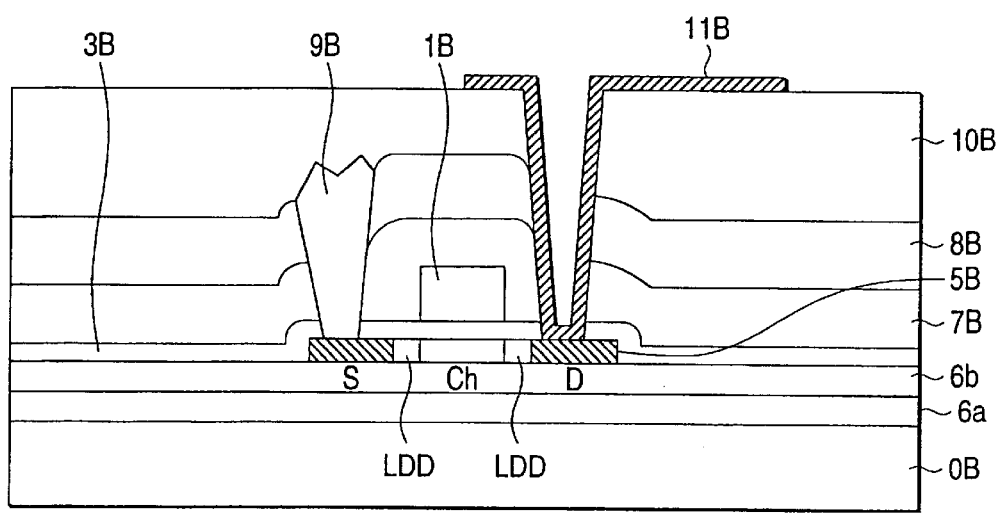

FIGS. 31A to 31C are process diagrams showing a process for producing a then film transistor using the semiconductor thin film produced by the process for producing a semiconductor thin film according to the sixth aspect of the invention as an active layer. In particular, a desired effect can be obtained by applying the process for producing a semiconductor thin film to a thin film transistor having a top gate structure. That is, in the case of the top gate structure, as different from the bottom gate structure, because a gate electrode is not present under the semiconductor thin film, the heat distribution on irradiation with laser light becomes uniform throughout the whole surface of the substrate, and thus the semiconductor thin film can be uniformly crystallized. As shown in FIG. 31A, two underlayer films 6a and 6b (lower insulating layer) as a buffer layer are firstly formed on an insulating substrate are continuously formed 0B by a catalytic CVD method. In some cased, a plasma CVD method can be employed. The first underlayer film 6a comprises $SiN_x$ and has a thickness of from 100 to 200 nm. The second underlayer film 6b comprises $SiO_2$ and has a thickness of from 100 to 200 nm. on the underlayer film 6b comprising $SiO_2$, a semiconductor thin film 4B comprising amorphous silicon is formed by a plasma CVD method or a LPCVD method to have a thickness of about from 30 to 80 nm. In the case where the formation of the semiconductor thin film 4B comprising amorphous silicon is conducted by using a plasma CVD method, the semiconductor thin film is annealed at 400 to 450° C. for about 1 hour in a nitrogen atmosphere to remove hydrogen contained in the film. The amorphous semiconductor thin film 4B is then crystallized by excimer laser annealing. In this annealing step, after forming a film of non-single crystal silicon on the substrate 0B, the semiconductor thin film is irradiated once or more with a pulse of laser light having an emission time width of 50 ns or more and having a constant cross sectional shape under the condition in that the substrate 0B is uniformly heated, so as to convert the non-single crystal silicon contained in the irradiated region corresponding to the cross sectional area of the laser light to polycrystalline silicon.

Subsequently, as shown in FIG. 31B, the resulting polycrystalline semiconductor thin film 5B is patterned to an island form by etching. A gate oxide film 3B is grown thereon by a CVD method to have a thickness of from 10 to 400 nm. Vth ion implantation is conducted depending on necessity, and a B$^+$ ion is implanted into the semiconductor thin film 5B at a dose amount, for example, of from $0.5 \times 10^{12}$ to $4 \times 10^{12}$ atoms/cm$^2$. The accelerated voltage at this time is about 80 KeV. The Vth ion implantation may be conducted before forming the gate insulating film 3B. A line beam shaped to have a width of 620 mm is used in the Vth ion implantation. A film of Al, Ti, Mo, W, Ta, doped polycrystalline silicon or an alloy thereof having a thickness of from 200 to 800 nm is formed on the gate insulating film 3B, which is then patterned to a prescribed shape to form a gate electrode 1B. A P$^+$ ion is then implanted to the semiconductor thin film 5B by an ion implantation method using mass separation, so as to provide an LDD region. This ion implantation is conducted on the whole surface of the insulating substrate 0B by using the gate electrode 1B as a mask. The dose amount is from $6 \times 10^{12}$ to $5 \times 10^{13}$ atoms/cm$^2$. The channel region Ch positioned under the gate electrode 1B is protected, and the B$^+$ ions implanted by the Vth ion implantation are maintained as they are. After the ion implantation to the LDD region, a resist pattern is formed to cover the gate electrode 1B and its periphery, and a P$^+$ ion is implanted to a high concentration by an ion shower doping method of a mass non-separation type, so as to form a source region S and a drain region D. The dose amount in this case is, for example, about $1 \times 10^{15}$ atoms/ cm². As the doping gas, a 20% $PH_3$ gas diluted with hydrogen is used. In the case where a CMOS circuit is produced, after forming a resist pattern for a p channel thin film transistor, the doping gas is changed to a 5 to 20% $B_2H_6/H_2$ gas system, and ion implantation is conducted to a dose amount of from $1\times10^{15}$ to $3\times10^{15}$ atoms/cm². The formation of the source region S and the drain region D may be conducted by using an ion implantation apparatus of a mass separation type. Thereafter, the dopant implanted in the semiconductor thin film 5B is subjected to an activation treatment.

Finally, as shown in FIG. 31C, an interlevel insulating film 7B comprising, for example, PSG is formed to cover the gate electrode 1B. After forming the interlevel insulating film 7B, SiNx is accumulated to a thickness of from 200 to 400 nm by a plasma CVD method to form a passivation film (cap film) 8B. In this stage, annealing is conducted in a nitrogen gas at 350° C. for about 1 hour to diffuse hydrogen contained in the interlevel insulating film 7B into the semiconductor thin film 5B. Contact holes are then formed. Furthermore, a film of, for example, AlSi is formed on the passivation film 8B by sputtering and then patterned to a prescribed shape to form a wiring electrode 9B. A flattening layer 10B having a thickness of about 1 $\mu$m comprising an acrylic resin is then coated, and a contact hole is formed therein. A transparent conductive film comprising ITO or IXO is formed on the flattening layer 10B by sputtering, which is then patterned to a prescribed shape to form a pixel electrode 11B.

Figure 32A:
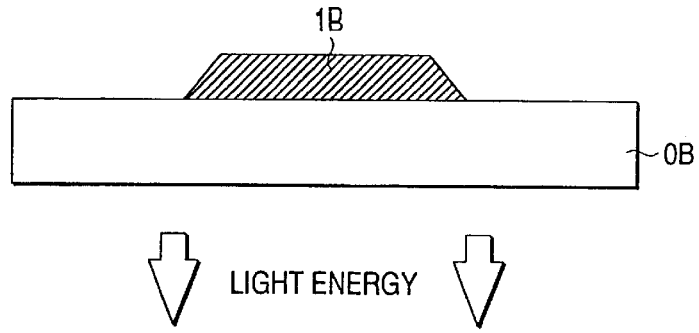
FIGS. 32A to 32D are a process diagram showing a process for producing a thin film transistor utilizing the process for producing a semiconductor thin film according to the fourth aspect of the invention.

FIGS. 32A to 32D are process diagrams showing a process for producing a thin film transistor utilizing the process for producing a semiconductor thin film according to the fourth aspect of the invention. Firstly, as shown in FIG. 32A, a film comprising Mo, Ta, W or Cr is formed on an insulating substrate 0B by sputtering and then patterned to a prescribed shape to form a gate electrode 1B. In order to produce a liquid crystal display device, a transparent material, such as glass, quartz glass and quartz, is used as the insulating substrate 0B. However, the invention is not limited to them, but a silicon substrate of high resistance can also be used. Furthermore, while only an n channel type thin film transistor is produced in this embodiment, a p channel type thin film transistor can also be similarly produced. In this embodiment, a thin film transistor of a bottom gate structure is produced. After forming a film of Mo, Ta, W or Cr is formed by sputtering as described in the foregoing, a resist is patterned to a gate form by photolithography, and the metallic film is then etched to the shape of a gate electrode 1B by using the patterned resist as a mask.

Figure 32B:
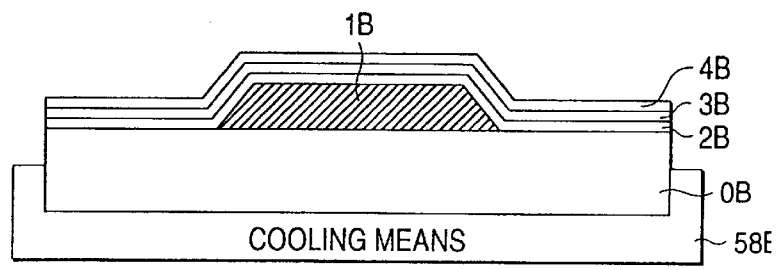

Subsequently, as shown in FIG. 32B, a gate nitride film 2B and a gate oxide film 3B are continuously formed on the gate electrode 1B, for example, by a plasma CVD method. In this embodiment, the gate nitride film 2B ($SiN_x$) is accumulated to a thickness of 100 nm, and the gate oxide film 3B ($SiO_2$) is accumulated to a thickness of 100 nm. An amorphous semiconductor thin film 4B to be an active layer of the thin film transistor is formed by a CVD method. In this embodiment, amorphous silicon is accumulated to a thickness of from 5 to 95 nm by a plasma CVD method. The amorphous semiconductor thin film 4B is once melted by irradiating with light energy, such as excimer laser light, and it is then converted to a polycrystalline semiconductor thin film 5B through a cooling step. In this annealing step, the substrate 0B is irradiated once or more with a pulse of laser light having an emission time width of 50 ns or more and having a constant cross sectional shape under the condition in that the substrate 0B is cooled to a temperature (for example, 10° C.) lower than room temperature by cooling means 58B, so as to convert the semiconductor thin film 4B contained in the irradiated region corresponding to the cross sectional area of the pulse to a polycrystalline material at a time. In the annealing step, cooling is conducted at a temperature lower than the substrate temperature that has been increased by irradiation laser light by 50° C. or more. More preferably, cooling is conducted at a temperature lower than the substrate temperature that has been increased by irradiation laser light by 100° C. or more. In the annealing step, the substrate is irradiated with a pulse of laser light having a cross sectional area of from 10 to 100 cm². When the substrate 0B is cooled on crystallization, the semiconductor thin film is quenched on completing the irradiation of laser light, and thus the probability of generation of crystal nuclei is increased. As a result, the number of crystal particles is increased, and a polycrystalline semiconductor thin film 5B having uniform crystal particle diameters can be obtained. By using the semiconductor thin film is used as an active layer, the characteristics of the thin film transistors can be uniform.

Figure 32C:
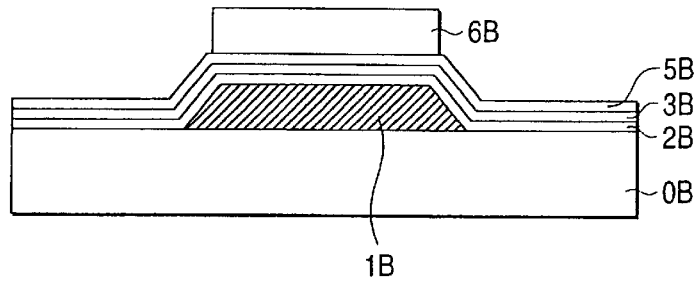

In the step shown in FIG. 32C, a film of $SiO_2$ is formed on the polycrystalline semiconductor thin film 5B, and the $SiO_2$ film is etched by masking the part of the channel region with a photoresist, so as to form a stopper film 6B for protecting the channel region. Thereafter, an impurity, such as P and As, is implanted to a part of the polycrystalline semiconductor thin film 5B to be a source region and a drain region. Irradiation of laser light is then again conducted to activate the implanted impurity. The energy density at this time is smaller than that used for crystallization of the semiconductor thin film. As for the activation of the impurity, an RTA using, for example, an ultraviolet lamp may be employed instead of laser annealing.

Figure 32D:
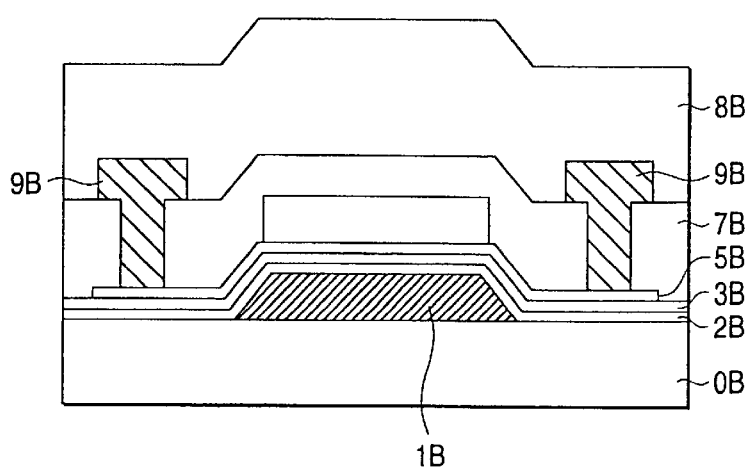

Finally, in the process shown in FIG. 32D, the semiconductor thin film 5B and the stopper film 6B are simultaneously patterned to separate respective thin film transistors. In order for passivation of the active layer, a film of $SiO_2$ having a thickness of 300 nm is formed to be an interlevel insulating film 7B. Contact holes are formed in the interlevel insulating film 7B, and a metallic film, such as Al, Mo, W and Ti, is formed and patterned to a shape of a signal line to form a wiring electrode 9B. A film of $SiN_x$ having a thickness of 200 nm is formed on the wiring electrode 9B to form a passivation film 8B. The thin film transistor having a bottom gate structure thus produced can be employed, for example, in a peripheral driving circuit of an active matrix type display device.

Figure 33:
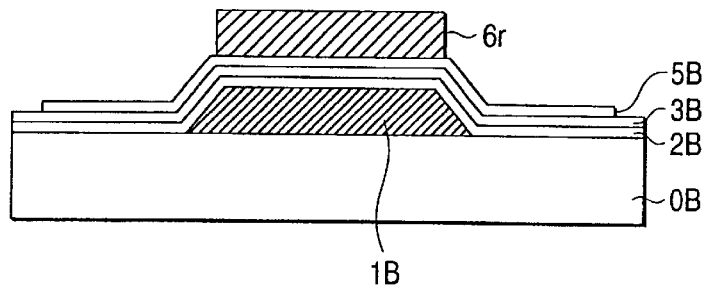
FIG. 33 is a schematic diagram showing a modified embodiment of the process for producing a thin film transistor shown in FIGS. 32A to 32D.

FIG. 33 is a schematic diagram showing a modified embodiment of the process for producing a thin film transistor shown in FIGS. 32A to 32D. In this embodiment, $SiO_2$ is not used as a stopper film, but a resist 6r is directly formed on the channel region as a mask by photolithography. Furthermore, a polycrystalline semiconductor thin film 5B is directly formed on the gate oxide film 3B by, for example, a CVD method using a catalyst. It is possible to form a polycrystalline semiconductor thin film 5B, not an amorphous semiconductor thin film, by controlling the film formation conditions. Thereafter, the polycrystalline semiconductor thin film 5B is treated by laser annealing to conduct recrystallization or to increase the particle diameter.

Figure 34A:
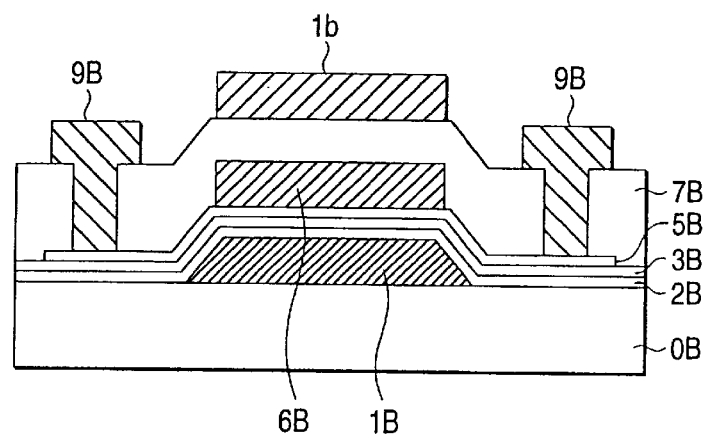
FIGS. 34A and 34B are a process diagram showing another embodiment of the process for producing a thin film transistor.
Figure 34B:
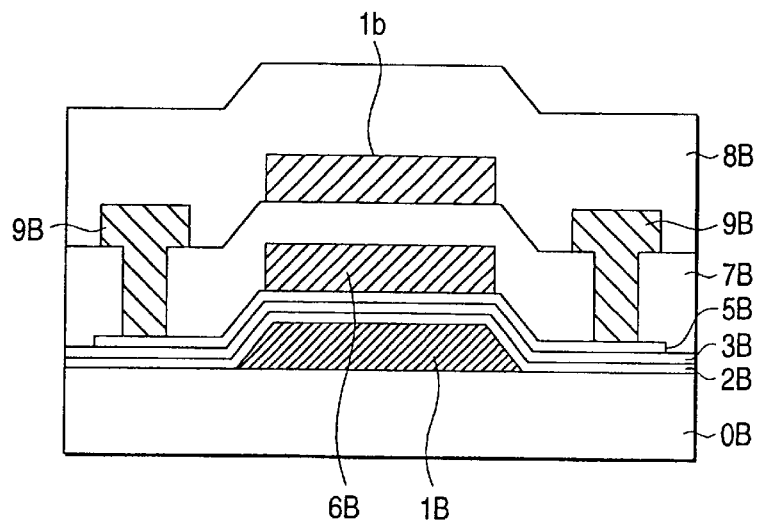

FIGS. 34A and 34B are process diagrams showing another embodiment of the process for producing a thin film transistor. Basically, after completing the steps shown in FIGS. 32A to 32C, the state shown in FIG. 34A is obtained, and then a thin film transistor of a so-called double gate (double sided gate) type is produced. As shown in FIG. 34A, the polycrystalline semiconductor thin film 5B and the stopper film 6B are simultaneously patterned to separate the respective thin film transistors. Thereafter, in order for passivation of the active layer, a film of $SiO_2$ having a thickness of 300 nm is formed to be an interlevel insulating film 7B. Contact holes reaching the source region and the drain region are formed in the interlevel insulating film 7B, and a metallic film of Al, Mo, W or Ti is formed and patterned to a shape of a signal line to form a wiring electrode 9B. At this time, a gate electrode 1b of the top side is simultaneously formed. Finally, as shown in FIG. 34B, a film of $SiN_x$ having a thickness of 200 nm is formed to protect the top side gate electrode 1b and the wiring electrode 9B to form a passivation film 8B.

Figure 35A:
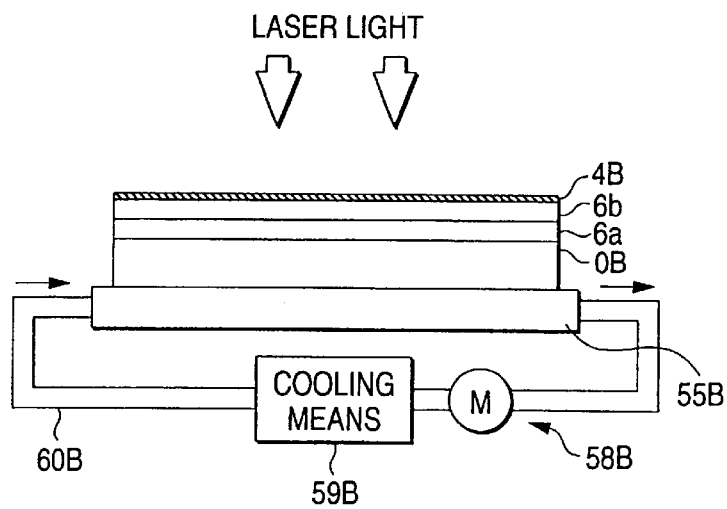
FIGS. 35A to 35C are a process diagram showing still another embodiment of the process for producing a thin film transistor.
Figure 35B:
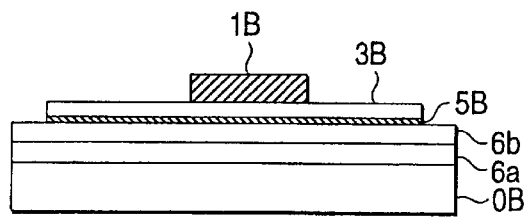
Figure 35C:
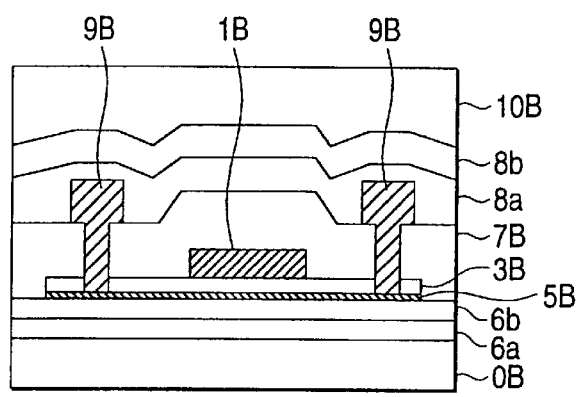

FIGS. 35A to 35C are process diagrams showing still another embodiment of the process for producing a thin film transistor. As shown in FIG. 35A, an $SiN_x$ film 6a and an $SiO_x$ film 6b having a thickness of from 10 to 1,000 nm are formed on an insulating substrate 0B comprising, for example, glass by a plasma CVD method, a normal pressure CVD method, a reduced pressure CVD method, a catalytic CVD method or a sputtering method for preventing diffusion of impurities from the substrate 0B. In this embodiment, an $SiN_x$ film 6a and an $SiO_x$ film 6b each having a thickness of 50 nm are formed by a plasma CVD method. Subsequently, a non-single crystal silicon semiconductor thin film 4B to be an active layer is formed by a plasma CVD method, a normal pressure CVD method, a reduced pressure CVD method, a catalytic CVD method or a sputtering method. In the case where a plasma CVD method is employed, annealing is conducted at a temperature of 300° C. or more for 10 to 360 minutes to reduce the hydrogen content of the film to 10 atomic % or less. The semiconductor thin film comprising non-single crystal silicon has a thickness of from 5 to 95 nm. In order to increase the crystal particle diameter of the non-single crystal silicon, it is then irradiated with laser light. As a laser light source, an excimer laser light source, such as KrF and XeCl, is used, and the irradiation is conducted at a time on a region of from 10 to 100 $cm^2$. The energy density of the irradiation is from 150 to 900 $mJ/cm^2$. At this time, the substrate 0B is cooled to a temperature of 10° C. or less by using cooling means 58B. The cooling means 58B comprises a cooling tube 60B embedded in a stage 55B carrying the insulating substrate 0B, and a radiator 59B and a pump M both connected to the cooling tube 60B. A cooling medium, such as $H_2O$, $CO_2$ and $N_2$, flows in the cooling tube 60B.

Subsequently, as shown in FIG. 35B, the crystallized semiconductor thin film 5B is separated by etching to an island form corresponding to the shape of the device region. A film of $SiN_x$, $SiO_x$ or $SiO_2$ is then formed by a plasma CVD method, a normal pressure CVD method, a reduce pressure CVD method, a catalytic CVD method or a sputtering method as a gate insulating film 3B. The gate insulating film 3B is of a single layer structure or a multi-layer structure comprising the films of the kind described above. In this embodiment, an $SiN_x$ film having a thickness of 100 nm and an $SiO_x$ film having a thickness of 100 nm are formed. A film of Mo, MoTa, W or Cr is then formed by sputtering or vapor deposition and patterned to a gate shape as a gate electrode 1B. An impurity, such as P and As, is implanted to a part of source and drain in a self-alignment manner. In the case where an LDD region is formed in the thin film transistor, after implanting an impurity at a low concentration by using the gate electrode 1B as a mask, a photoresist is formed outside the gate electrode 1B, and an impurity is again implanted at a high concentration to form a source region and a drain region. In order to activate the impurity thus implanted, irradiation with laser light is again conducted. The energy density of the laser irradiation is set at a value lower than that of the laser light used for crystallization in the preceding step. As for the activation of the impurity, an RTA using, for example, an ultraviolet lamp or an infrared lamp, or a high-temperature oven may be employed instead of laser light.

As shown in FIG. 35C, an $SiO_2$ film 7B having a thickness of 300 nm is formed for passivation, and contact holes are opened at prescribed positions corresponding to the source region and the drain region. Subsequently, a single layer or multi-layer film of a simple metal of Al, Mo, W, Ti, Nd or Cu, or a compound thereof is formed and patterned to a prescribed shape as a signal line 9B. An $SiO_2$ film 8a, an $SiN_x$ film 8b and an organic film 10B each having a thickness, for example, of 200 nm are formed to cover the signal line 9B.

As described in the foregoing, according to the fourth aspect of the invention, in the annealing step for crystallization of a semiconductor thin film, the semiconductor thin film is irradiated once or more with a pulse of laser light having an emission time width of 50 ns or more from upstand to downfall and having a constant cross sectional area, so as to convert the semiconductor thin film contained in the irradiated region corresponding to the cross sectional area of the laser light to a polycrystalline material at a time, and the energy intensity of the laser light from upstand to downfall is controlled to apply a desired change. According to the manner, a polycrystalline semiconductor thin film having a large crystal particle diameter is formed on the substrate. A thin film transistor having a large mobility can be produced by using the semiconductor thin film as an active layer. Because irradiation of laser light can be conducted at a time, the laser recrystallization of the semiconductor thin film formed on a large scale substrate can be conducted in a short period of time. Because the energy intensity of the laser light itself can be uniform, uniform crystal particle diameters can be obtained. According to the fifth aspect of the invention, in the annealing step, the semiconductor thin film is irradiated once or more to the substrate with a pulse of laser light having an emission time width of 50 ns or more and having a constant cross sectional area under the condition in that the substrate is maintained in a non-oxidative atmosphere, so as to convert the semiconductor thin film contained in the irradiated region corresponding to the cross sectional area of the laser light to a polycrystalline material at a time. Therefore, a polycrystalline semiconductor thin film having less crystal defects can be formed on the substrate, and a thin film transistor having a high mobility using the semiconductor film as an active layer can be obtained. In particular, an active matrix type display device having a high added value comprising a peripheral circuit contained in the panel can be produced. According to the sixth aspect of the invention, in the annealing step, the semiconductor thin film is irradiated once or more with a pulse of laser light having an emission time width of 50 ns or more and having a constant cross sectional area under the condition in that the substrate is uniformly heated, so as to convert the semiconductor thin film contained in the irradiated region corresponding to the cross sectional area of the laser light to a polycrystalline material at a time. Even though a laser irradiation device exhibiting a large dispersion in energy of pulses is employed, uniform crystallinity can be obtained by using the substrate heating mechanism, and thus dispersion in device characteristics can be considerably suppressed. In particular, when the substrate is heated in vacuum or in an inert gas atmosphere, contamination due to the air and oxidation on crystallization by laser irradiation can be prevented, and thus the semiconductor thin film can be stabilized to obtain uniform and good device characteristics. By providing the heating mechanism, the energy density required for laser annealing is decreased, and the irradiated area can be correspondingly enlarged. As a result, the productivity can be improved by reducing the tact time. According to the seventh aspect of the invention, in the annealing step, the semiconductor thin film is irradiated once or more with a pulse of laser light having an emission time width of 50 ns or more and having a constant cross sectional area under the condition in that the substrate is cooled to a temperature lower than room temperature, so as to convert the semiconductor thin film contained in the irradiated region corresponding to the cross sectional area of the laser light to a polycrystalline material at a time. The probability of generation of crystal nuclei can be increased by quenching on crystallization. By employing the procedure, the number of the crystal particles contained in the semiconductor thin film can be increased, and thus a polycrystalline semiconductor thin film having uniform crystal particle diameters can be obtained. The characteristics of the thin film transistor can be uniform by using the semiconductor thin film as an active layer.

The invention is not limited to the effects of the respective aspects and embodiments of the invention, but combinations of the aspects and embodiments can function and are included in the invention.

What is claimed is:

1. A laser irradiation apparatus, by which a semiconductor thin film comprising an amorphous material or a polycrystalline material having a relatively small particle diameter formed on a substrate is irradiated with laser light to convert into a polycrystalline material having a relatively large particle diameter, said laser irradiation apparatus comprising
a laser light source emitting laser light having a prescribed cross sectional shape;
shaping means of shaping said cross sectional shape of said laser light to adjust to a prescribed region; and
irradiating means of irradiating a semiconductor thin film with said shaped laser light to uniformly crystallize in said region.

2. A laser irradiation apparatus, by which a semiconductor thin film comprising an amorphous material or a polycrystalline material having a relatively small particle diameter formed on a substrate capable of carrying information for processing is irradiated with laser light to convert into a polycrystalline material having a relatively large particle diameter, at least one condition selected from a cross sectional shape, an irradiating position, an energy amount, an energy distribution and a moving direction of said laser light is capable of being adjusted by reading said information.

3. A laser irradiation apparatus as claimed in claim 2, wherein said information is read by recognizing a pattern formed on a surface of said substrate.

4. A laser irradiation apparatus as claimed in claim 2, wherein said information is read by detecting a code written in said substrate.

5. A laser irradiation apparatus, by which a semiconductor thin film comprising an amorphous material or a polycrystalline material having a relatively small particle diameter formed on a substrate, on which prescribed units are formed, is intermittently irradiated with laser light moving with respect said semiconductor thin film to convert into a polycrystalline material having a relatively large particle diameter, said laser irradiation apparatus comprising
a laser light source intermittently emitting laser light;
an optical system for enlarging or reducing a cross sectional shape of said laser light to adjust to said units; and
shielding means for shielding a part other than said units from the laser light,
wherein irradiation is conducted by bulk irradiation of one or two or more units at a time by a single shot irradiation.

6. A laser irradiation apparatus as claimed in claim 5, wherein said apparatus further comprises moving means for moving said substrate with respect to said laser light to make possible to irradiate all of said units with said laser light.

7. A laser irradiation apparatus as claimed in claim 6, wherein said apparatus further comprises detecting means for optically reading a positioning mark provided on said substrate, and controlling means for controlling said moving means corresponding said mark thus read.

8. An apparatus for producing a semiconductor thin film comprising
a film formation chamber where a semiconductor thin film comprising an amorphous material or a polycrystalline material having a relatively small particle diameter is formed on a substrate; and
a laser annealing chamber where a prescribed region of said semiconductor thin film is irradiated at a time with laser light having a prescribed cross sectional area to convert said amorphous material or said polycrystalline material having a relatively small particle diameter to a polycrystalline material having a relatively large particle diameter,
wherein said apparatus further comprises means for transporting said substrate back and forth between said film forming chamber and said laser annealing chamber without exposing said substrate to the air, so as to accumulate said semiconductor thin films by alternately repeating said film forming step and said laser annealing step.

9. An apparatus for producing a semiconductor thin film as claimed in claim 8, wherein said laser annealing chamber comprises irradiating with laser light at a condition in that $TE/(d \cdot S)$ is from 0.01 to 1, wherein $d$ (nm) represents a thickness of said semiconductor thin film having been formed, $TE$ (J) represents total energy of said laser light, and $S$ ($cm^2$) represents an area of a region irradiated with said laser light at a time.

10. An apparatus for producing a semiconductor thin film as claimed in claim 8, wherein said laser annealing chamber is repeated with said laser light having such energy that is being increased along with the lapse of said steps.

11. An apparatus for producing a semiconductor thin film as claimed in claim 8, wherein said film forming chamber is repeated to form a semiconductor thin film having such a thickness that is being decreased along with the lapse of said steps.

12. A laser irradiation apparatus for irradiating a semiconductor thin film comprising an amorphous material or a polycrystalline material having a relatively small particle diameter formed on a substrate with laser light to convert into a polycrystalline material having a relatively large particle diameter, said laser irradiation apparatus comprising
- a laser light source emitting a pulse of laser light having an emission time width from upstand to downfall of 50 ns or more;
- shaping means for shaping a cross sectional area of said laser light to a prescribed shape;
- irradiating means for irradiating said semiconductor thin film at least once with said pulse of laser light thus shaped, so as to convert said semiconductor thin film contained in an irradiated area corresponding to said cross sectional area to a polycrystalline material at a time; and
- controlling means for controlling an energy intensity of said laser light from upstand to downfall to apply a desired change.

13. A laser irradiation apparatus as claimed in claim 12, wherein said controlling means has an inclined change in that an energy intensity at downfall is smaller than an energy intensity at upstand.

14. A laser irradiation apparatus as claimed in claim 12, wherein said controlling means has an inclined change in that an energy intensity at downfall is larger than an energy intensity at upstand.

15. A laser irradiation apparatus as claimed in claim 12, wherein in said controlling means, when an energy density of said laser light is controlled to apply a desired change, a changing width thereof is 300 mJ/cm$^2$ or less.

16. A laser irradiation apparatus as claimed in claim 12, wherein said shaping means comprises irradiating of said laser light having a cross sectional area of 100 cm$^2$ or more to a rectangular shape.

17. A laser irradiation apparatus for irradiating a semiconductor thin film comprising an amorphous material or a polycrystalline material having a relatively small diameter formed on a substrate with laser light to convert to a polycrystalline material having a relatively large particle diameter,
said laser irradiation apparatus comprising
- a laser light source emitting a pulse of laser light having an emission time width of 50 ns or more;
- shaping means for shaping a cross sectional area of the laser light to a prescribed shape;
- maintaining means for maintaining said substrate previously having a semiconductor thin film in a non-oxidative atmosphere; and
- an irradiating means for irradiating said substrate maintaining in said non-oxidative atmosphere once or more with said pulse of laser light thus shaped, so as to convert said semiconductor thin film contained in an irradiated region corresponding to said cross sectional area to a polycrystalline material at a time.

18. A laser irradiation apparatus as claimed in claim 17, wherein said maintaining means maintains said substrate in said non-oxidative atmosphere comprising vacuum.

19. A laser irradiation apparatus as claimed in claim 17, wherein said maintaining means maintains said substrate in said non-oxidative atmosphere filled with an inert gas.

20. A laser irradiation apparatus as claimed in claim 19, wherein said maintaining means maintains said substrate in said non-oxidative atmosphere filled with an inert gas at an atmospheric pressure or in a pressurized inert gas.

21. A laser irradiation apparatus as claimed in claim 17, wherein said shaping means shapes said pulse of laser light to a rectangular shape having a cross sectional area of 5 cm$^2$ or more.

22. A laser irradiation apparatus as claimed in claim 17, wherein said irradiating means irradiates said substrate with said laser light having an energy intensity controlled to a range of from 400 to 600 mJ/cm$^2$.

23. A laser irradiation apparatus for irradiating a semiconductor thin film comprising an amorphous material or a polycrystalline material having a relatively small diameter with laser light formed on a substrate with laser light to convert to a polycrystalline material having a relatively large particle diameter,
said laser irradiation apparatus comprising
- a laser light source emitting a pulse of laser light having an emission time width of 50 ns or more;
- shaping means for shaping a cross sectional area of said laser light to a constant shape;
- heating means for uniformly heating said substrate previously having a semiconductor thin film; and
- irradiating means for irradiating said heated substrate once or more with said pulse of laser light thus shaped, so as to convert said semiconductor thin film contained in an irradiated region corresponding to said cross sectional area to a polycrystalline material at a time.

24. A laser irradiation apparatus as claimed in claim 23, wherein said heating means uniformly heats said substrate comprising glass to a range of from 300 to 450° C.

25. A laser irradiation apparatus as claimed in claim 23, wherein said heating means comprises a heat source built in a stage carrying said substrate.

26. A laser irradiation apparatus as claimed in claim 23, wherein said heating means heats said substrate with maintaining said substrate in a vacuum atmosphere.

27. A laser irradiation apparatus as claimed in claim 23, wherein said heating means heats said substrate with maintaining said substrate in an inert gas atmosphere.

28. A laser irradiation apparatus for irradiating a semiconductor thin film comprising an amorphous material or a polycrystalline material having a relatively small diameter formed on a substrate with laser light to convert to a polycrystalline material having a relatively large particle diameter,
said laser irradiation apparatus comprising
- a laser light source emitting a pulse of laser light having an emission time width of 50 ns or more;
- shaping means for shaping a cross sectional area of the laser light to a constant cross sectional area;
- cooling means for cooling said substrate previously having a semiconductor thin film to a temperature lower than room temperature; and
- an irradiating means for irradiating said cooled substrate once or more with said pulse of laser light thus shaped, so as to convert said semiconductor thin film contained in an irradiated region corresponding to said cross sectional area to a polycrystalline material at a time.

29. A laser irradiation apparatus as claimed in claim 28, wherein said cooling means cools to a substrate temperature lower by 50° C. or more than said substrate temperature increased by irradiation with laser light.

30. A laser irradiation apparatus as claimed in claim 28, wherein said cooling means cools to a substrate temperature lower by 50° C. or more than said substrate temperature increased by irradiation with laser light.

* * * * *